(12) United States Patent
Ahn et al.

(10) Patent No.: US 12,471,269 B2
(45) Date of Patent: Nov. 11, 2025

(54) SEMICONDUCTOR DEVICE

(71) Applicant: SAMSUNG ELECTRONICS CO., LTD., Suwon-si (KR)

(72) Inventors: Junhyeok Ahn, Suwon-si (KR); Kiseok Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 446 days.

(21) Appl. No.: 18/078,217

(22) Filed: Dec. 9, 2022

(65) Prior Publication Data

US 2023/0371235 A1    Nov. 16, 2023

(30) Foreign Application Priority Data

May 16, 2022  (KR) .......................... 10-2022-0059414

(51) Int. Cl.
*H10B 12/00* (2023.01)
(52) U.S. Cl.
CPC ................................. *H10B 12/315* (2023.02)
(58) Field of Classification Search
CPC ............................................. H10B 12/315
See application file for complete search history.

(56) References Cited

U.S. PATENT DOCUMENTS

| | | | |
|---|---|---|---|
| 7,728,375 B2 | 6/2010 | Shin et al. | |
| 9,202,774 B2 | 12/2015 | Yeom et al. | |
| 10,361,120 B2 | 7/2019 | Wang et al. | |
| 10,453,796 B2 | 10/2019 | Song et al. | |
| 10,580,693 B2 | 3/2020 | Chang et al. | |
| 10,825,819 B2 | 11/2020 | Kim et al. | |
| 2015/0340453 A1* | 11/2015 | Cho | H10B 12/482 257/330 |
| 2019/0296026 A1* | 9/2019 | Ji | H01L 21/31144 |
| 2021/0066200 A1* | 3/2021 | Park | H10B 12/485 |
| 2021/0296237 A1 | 9/2021 | Kim et al. | |
| 2022/0384449 A1 | 12/2022 | Kim et al. | |
| 2023/0144120 A1* | 5/2023 | Chen | H10D 62/115 257/295 |

FOREIGN PATENT DOCUMENTS

TW     202201732 B    7/2022

OTHER PUBLICATIONS

Office Action dated Oct. 11, 2023 issued by the Taiwan Intellectual Property Office for corresponding patent application TW 112101756.

\* cited by examiner

*Primary Examiner* — Steven M Page
(74) *Attorney, Agent, or Firm* — Muir Patent Law, PLLC

(57) ABSTRACT

A semiconductor device includes a substrate including an active region, a word line structure crossing the active region and extending in a first direction, a bit line structure extending in a second direction, a bit line contact electrically connecting a first impurity region of the active region to the bit line structure, a storage node contact on a sidewall of the bit line structure and electrically connected to a second impurity region of the active region, and a contact barrier layer covering at least a portion of the bit line contact, wherein the bit line contact includes a lower portion having a first width and an upper portion on the lower portion and having a second width, the first width is greater than the second width, and the contact barrier layer covers a bottom surface and a side surface of the lower portion.

20 Claims, 19 Drawing Sheets

SEMICONDUCTOR DEVICE

CROSS-REFERENCE TO RELATED APPLICATION

This application claims benefit of priority to Korean Patent Application No. 10-2022-0059414, filed on May 16, 2022, in the Korean Intellectual Property Office, the disclosure of which is incorporated herein by reference in its entirety.

BACKGROUND

1. Field

Embodiments relate to a semiconductor device.

2. Description of the Related Art

According to the development of the electronics industry and the user needs, electronic devices have become smaller and higher in performance. Accordingly, semiconductor devices used in electronic devices are also required to be highly integrated and exhibit high-performance.

SUMMARY

According to embodiments, a semiconductor device includes a substrate including an active region; a word line structure crossing the active region and extending in a first horizontal direction; a bit line structure extending in a second horizontal direction, intersecting the first horizontal direction, on the substrate; a bit line contact electrically connecting a first impurity region of the active region to the bit line structure; a storage node contact disposed on a sidewall of the bit line structure and electrically connected to a second impurity region of the active region; and a contact barrier layer covering at least a portion of the bit line contact, wherein the bit line contact includes a lower portion having a first width in the first horizontal direction and an upper portion disposed on the lower portion and having a second width in the first horizontal direction, the first width is greater than the second width, and the contact barrier layer covers a bottom surface and a side surface of the lower portion.

According to embodiments, a semiconductor device includes a substrate including an active region having a first impurity region and a second impurity region; a word line structure crossing the active region and extending in a first horizontal direction in the substrate; a metal-semiconductor compound pattern disposed on the first impurity region; a conductive pad electrically connected to the second impurity region on the substrate; an insulating pattern defining the conductive pad; a buffer layer on the conductive pad and the insulating pattern; a bit line structure extending in a second horizontal direction, intersecting the first horizontal direction, on the buffer layer; a bit line contact between the metal-semiconductor compound pattern and the bit line structure; a contact barrier layer between the metal-semiconductor compound pattern and the bit line contact; a storage node contact on the conductive pad; and an information storage structure electrically connected to the storage node contact, wherein the bit line contact includes a lower portion having a first width in the first horizontal direction and an upper portion disposed on the lower portion and having a second width in the first horizontal direction, the first width is greater than the second width, and the contact barrier layer extends from a bottom surface of the lower portion to cover at least a portion of an outer surface of the lower portion.

According to embodiments, a semiconductor device includes a substrate including an active region; a word line structure extending in a first horizontal direction; a bit line structure extending in a second horizontal direction, intersecting the first horizontal direction, on the substrate; a bit line contact electrically connecting a first impurity region of the active region to the bit line structure, the bit line contact having a lower portion and an upper portion on the lower portion; a storage node contact disposed on a sidewall of the bit line structure and electrically connected to a second impurity region of the active region; and a contact barrier layer covering at least a portion of a side surface and a bottom surface of the lower portion of the bit line contact below the bit line structure, wherein an upper end of the contact barrier layer is disposed at a level lower than that of the bit line structure, and the bit line contact may cover at least a portion of an upper surface of the contact barrier layer.

BRIEF DESCRIPTION OF DRAWINGS

Features will become apparent to those of skill in the art by describing in detail exemplary embodiments with reference to the attached drawings, in which.

DETAILED DESCRIPTION

Figure 1A:
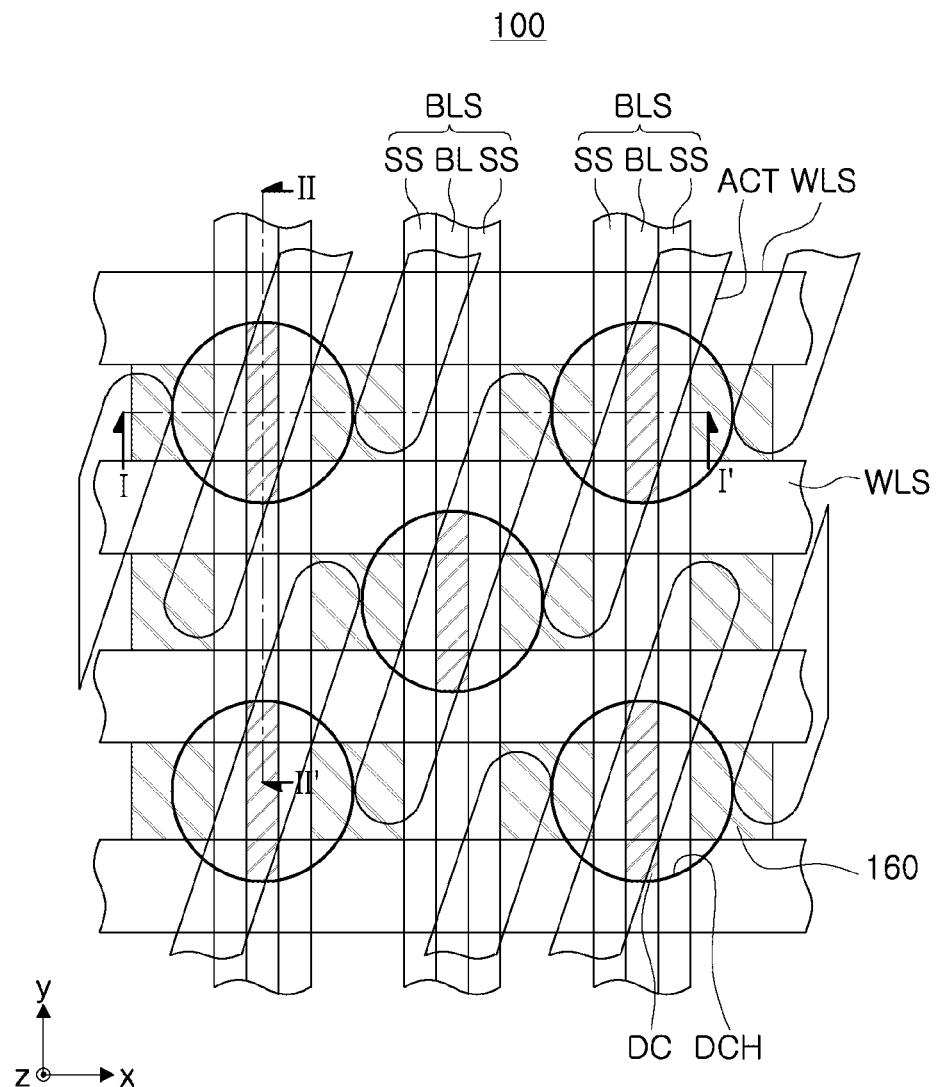
FIGS. 1A and 1B are schematic plan views of a semiconductor device according to example embodiments.
Figure 1B:
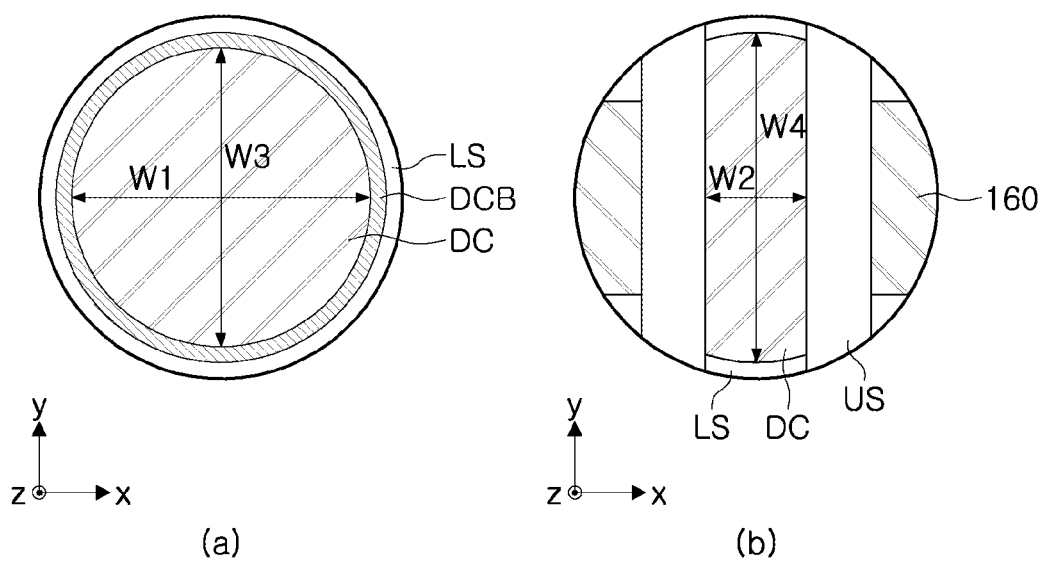

FIGS. 1A and 1B are schematic plan views of a semiconductor device 100 according to example embodiments. It is noted that (a) of FIG. 1B is a plan view corresponding to a lower region of a bit line contact hole DCH of FIG. 1A, and (b) of FIG. 1B is a plan view corresponding to an upper region of the bit line contact hole DCH of FIG. 1A.

Figure 2:
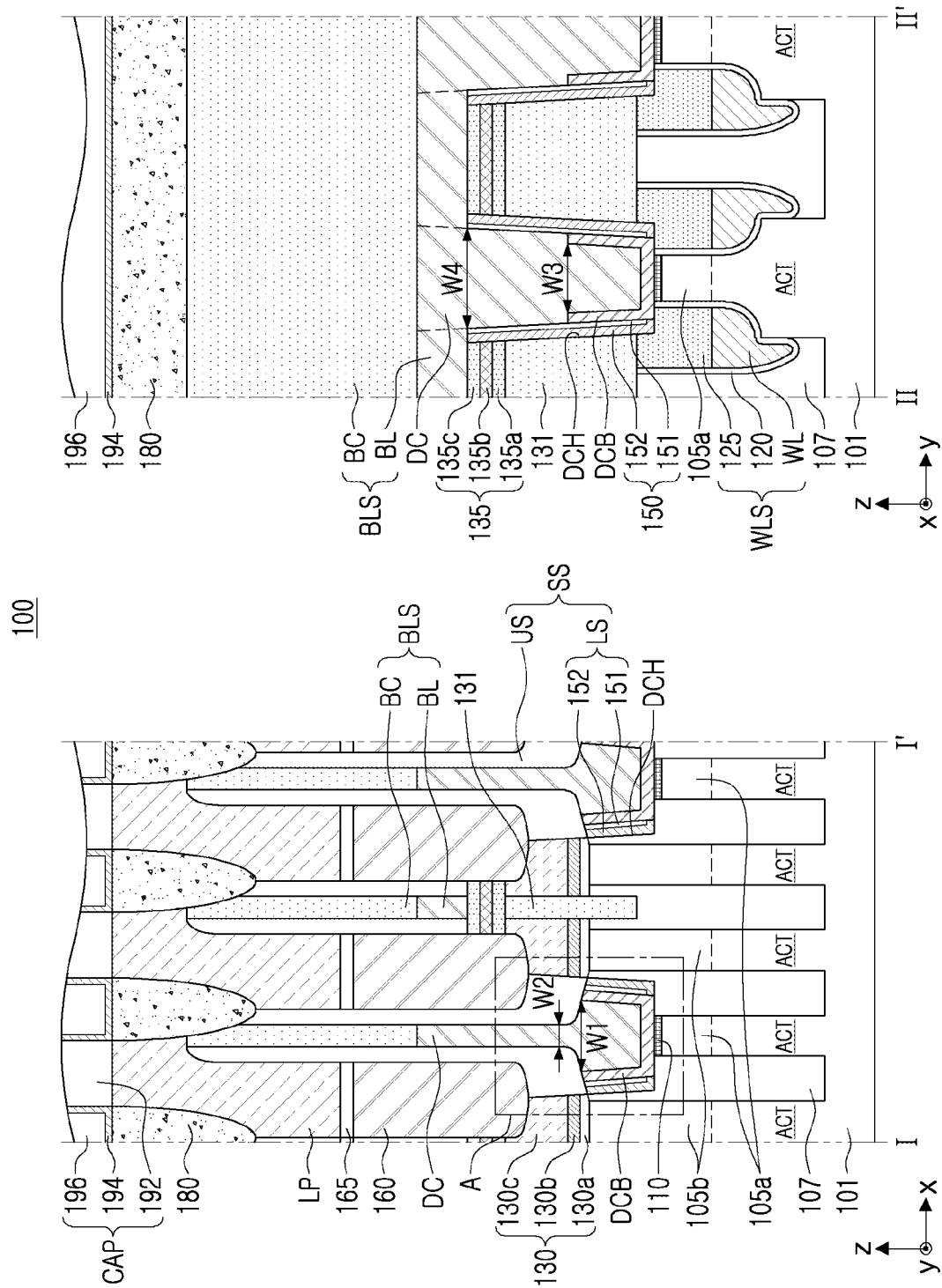
FIG. 2 is a schematic cross-sectional view of a semiconductor device according to example embodiments.
Figure 3:
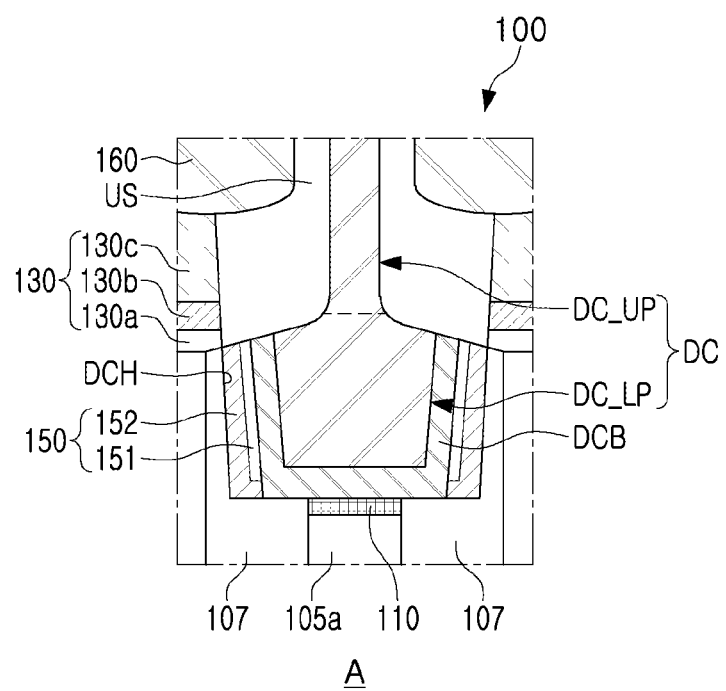
FIG. 3 is a partially enlarged cross-sectional view of a semiconductor device according to example embodiments.

FIG. 2 is a schematic cross-sectional view along lines I-I' and II-II' in FIG. 1A. FIG. 3 is an enlarged view of region 'A' of FIG. 2.

Referring to FIGS. 1A to 3, a semiconductor device 100 may include a substrate 101 including an active region ACT, a word line structure WLS embedded in the substrate 101 and extending therein and including a word line WL, a bit line structure BLS extending to intersect the word line structure WLS on the substrate 101 and including a bit line BL, spacer structures SS on both sides of the bit line structure BLS, a capacitor structure CAP disposed above the bit line structure BLS, a bit line contact DC electrically connecting the bit line structure BLS to the active region ACT, a storage node contact 160 electrically connecting the capacitor structure CAP to the active region ACT, a landing pad LP electrically connecting the storage node contact 160 to the capacitor structure CAP, and a capping insulating layer 180 on the bit line structure BLS. The semiconductor device 100 may further include device separation layers 107 defining the active region ACT, a metal-semiconductor compound pattern 110 on the substrate 101, and a contact barrier layer DCB between the metal-semiconductor compound pattern 110 and a bit line contact DC. The semiconductor device 100 may be applied to, e.g., a cell array of a dynamic random access memory (DRAM).

The substrate 101 may have an upper surface extending in an X-direction and a Y-direction. The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may be a silicon substrate, a silicon-on-insulator (SOI) substrate, a germanium substrate, a germanium-on-insulator (GOI) substrate, a silicon-germanium substrate, or an epitaxial layer.

The active region ACT may be defined by the device separation layers 107. The active region ACT may have a bar shape, and may be disposed in an island shape extending in one direction, e.g., in one direction between the X-direction and the Y-direction, in the substrate 101. The one direction may be a direction inclined with respect to the extension directions of the word line WL and the bit line BL. The active region ACT may intersect the bit line structure BLS and/or the word line structure WLS.

The active region ACT may have first and second impurity regions 105a and 105b having a predetermined depth from an upper surface of the substrate 101. The first and second impurity regions 105a and 105b may be spaced apart from each other. The first and second impurity regions 105a and 105b may serve as source/drain regions of a transistor. For example, a drain region may be formed between two word lines WL intersecting one active region ACT, and a source region may be formed outside the two word lines WL, respectively. In an example embodiment, the first impurity region 105a may be the drain region, and the second impurity region 105b may be the source region. However, the source region and the drain region are formed by doping or ion implantation of substantially the same impurities, and may be referred to interchangeably depending on a circuit configuration of a finally formed transistor. The impurities may include dopants having a conductivity type opposite to that of the substrate 101. In example embodiments, depths of the first and second impurity regions 105a and 105b in the source region and the drain region may be different from each other.

The device separation layers 107 may be formed by a shallow trench isolation (STI) process. The device separation layers 107 may be a field region that surrounds the active region ACT and separates the active region ACT from each other. The device separation layers 107 may be formed of an insulating material, e.g., oxide, nitride, or combinations thereof. In an example embodiment, each of the device separation layers 107 may include a plurality of layers.

The metal-semiconductor compound pattern 110 may be disposed on the active region ACT. In an example embodiment, the metal-semiconductor compound pattern 110 may be disposed on the first impurity region 105a. The metal-semiconductor compound pattern 110 may include, e.g., cobalt silicide (CoSi), titanium silicide (TiSi), nickel silicide (NiSi), tungsten silicide (WSi), or other metal silicide. In an example embodiment, the metal-semiconductor compound pattern 110 may protrude from the first impurity region 105a, but the metal-semiconductor compound pattern 110 may have various shapes, e.g., the metal-semiconductor compound pattern 110 may be embedded in the first impurity region 105a, depending on the type of a metal element constituting the metal-semiconductor compound pattern 110. The metal-semiconductor compound pattern 110 may be formed to improve electrical characteristics between the bit line structure BLS including a metal material and the impurity regions 105a and 105b.

Each of the word line structures WLS may include a gate dielectric layer 120, a word line WL, and a buried insulating layer 125.

The word line WL may be disposed in gate trenches extending in the substrate 101. The word line WL may be disposed to extend in one direction, e.g., the X-direction, across the active region ACT in the substrate 101. For example, a pair of word lines WL may be disposed to cross one active region ACT. Transistors including the word line WL and the first and second impurity regions 105a and 105b may constitute a buried channel array transistor (BCAT).

The word line WL may be disposed below the gate trenches and may have a predetermined thickness. An upper surface of the word line WL may be positioned at a level lower than that of the upper surface of the substrate 101. In the present disclosure, a height level (e.g., "lower or higher level") may be defined based on, e.g., relative to, a substantially flat upper surface of the substrate 101. The word line WL may include a conductive material, e.g., at least one of polycrystalline silicon (Si), titanium (Ti), titanium nitride (TiN), tantalum (Ta), tantalum nitride (TaN), tungsten (W), tungsten nitride (WN), and aluminum (Al). In example embodiments, the word line WL may include a plurality of layers.

The gate dielectric layer 120 may be disposed on the bottom and inner surfaces of the gate trenches. The gate dielectric layer 120 may conformally cover inner walls of the gate trenches. The gate dielectric layer 120 may be disposed between the word line WL and the active region ACT, e.g., the gate dielectric layer 120 may extend along a side surface of the word line WL to cover the side surface of the word line WL. The gate dielectric layer 120 may include at least one of, e.g., oxide, nitride, and oxynitride. The gate dielectric layer 120 may be, e.g., a silicon oxide film or an insulating film having a high dielectric constant. In example embodiments, the gate dielectric layer 120 may be a layer formed by oxidizing the active region ACT or a layer formed by deposition.

The buried insulating layer 125 may be disposed on the word line WL and may fill the gate trenches. The buried insulating layer 125 may include an insulating material, e.g., silicon nitride. In an example embodiment, the gate dielectric layer 120 may extend along a side surface of the buried insulating layer 125 to cover the side surface of the buried insulating layer 125, e.g., the gate dielectric layer 120 be between the buried insulating layer 125 and the active region ACT. Alternatively, according to embodiments, an upper end of the gate dielectric layer 120 may be covered by the buried insulating layer 125.

In an example embodiment, the semiconductor device 100 may include a plurality of conductive pads 130 disposed on the substrate 101 and an insulating pattern 131 separating each of the plurality of conductive pads 130. Each of the plurality of conductive pads 130 may be electrically connected to the active region ACT. Lower surfaces of the plurality of conductive pads 130 may directly contact the second impurity region 105b of the active region ACT. That is, each of the plurality of conductive pads 130 may electrically connect the storage node contact 160 to the second impurity region 105b.

For example, as illustrated in FIG. 2, each of the plurality of conductive pads 130 may include a semiconductor material layer 130a, e.g., silicon, a metal-semiconductor layer 130b on the semiconductor material layer 130a, and a metal layer 130c on the metal-semiconductor layer 130b. In another example, each of the plurality of conductive pads 130 may be a single semiconductor layer according to embodiments, e.g., each of the plurality of conductive pads 130 may include silicon having an N-type conductivity.

The insulating pattern 131 may surround each of the conductive pads 130 between the plurality of conductive pads 130. The insulating pattern 131 may pass through the plurality of conductive pads 130 to achieve electrical separation of each of the plurality of conductive pads 130. The insulating pattern 131 may include an insulating material different from that of the device separation layers 107. The insulating material may be, e.g., silicon nitride. In an example embodiment, the insulating pattern 131 may be recessed deeper than the lower surfaces of the plurality of conductive pads 130 to have a lower surface at a level lower than that of the lower surfaces of the plurality of conductive pads 130. The uppermost surfaces of the plurality of conductive pads 130 and an upper surface of the insulating pattern 131 may be positioned on substantially the same level, e.g., to be level and coplanar with each other.

The buffer layer 135 may be disposed on the substrate 101. The buffer layer 135 may be disposed between the substrate 101 and the bit line structure BLS.

In an example embodiment, the buffer layer 135 may be disposed on the plurality of conductive pads 130 and the insulating pattern 131. In this case, the lower surface of the buffer layer 135 may contact, e.g., directly, the upper surface of the plurality of conductive pads 130 and the upper surface of the insulating pattern 131. The storage node contact 160 may be electrically connected to the active region ACT by passing through the buffer layer 135 and contacting the plurality of conductive pads 130. The buffer layer 135 may include an insulating material, e.g., silicon oxide, silicon nitride, silicon oxynitride, or combinations thereof.

In an example embodiment, the buffer layer 135 may include a first buffer layer 135a, a second buffer layer 135b, and a third buffer layer 135c. For example, the first buffer layer 135a may include silicon oxide, the second buffer layer 135b may include silicon nitride, and the third buffer layer 135c may include silicon oxide. However, according to embodiments, the buffer layer 135 may have any suitable material and number of layers, e.g., different material and number of layers relative to FIG. 2.

The bit line structure BLS may extend in one direction, perpendicular to the word line WL, e.g., in a Y-direction. The bit line structure BLS may include a bit line BL and a bit line capping pattern BC on the bit line.

The bit line BL may be disposed on the buffer layer 135. The bit line BL may include a metal material, e.g., a non-compounded metal. For example, the metal material may include tungsten (W), ruthenium (Ru), copper (Cu), or molybdenum (Mo). However, the number of conductive patterns constituting the bit line BL, the type of material, and/or the stacking order may be variously changed according to embodiments.

The bit line capping pattern BC may be disposed on the bit line BL. The bit line capping pattern BC may include an insulating material, e.g., a silicon nitride layer. However, the number of insulating patterns constituting the bit line capping pattern BC, the type of material, and/or the stacking order may be variously changed according to embodiments. Also, even if the bit line capping pattern BC includes a plurality of material layers and the plurality of material layers include the same material, boundaries may be distinguished by differences in physical properties.

The bit line contact DC may have an upper surface substantially on the same level as, e.g., coplanar with, that of the bit line BL and may, e.g., directly, contact the bit line capping pattern BC. The bit line contact DC may pass through the buffer layer 135 to contact the first impurity region 105a of the active region ACT. The bit line contact DC may be locally disposed in the bit line contact hole DCH exposing the first impurity region 105a.

In an example embodiment, the bit line contact DC may include a portion integrally, e.g., seamlessly, connected to the bit line BL and extending into the bit line contact hole DCH. Accordingly, the bit line contact DC may include the same metal material as that of the bit line BL, e.g., tungsten (W), ruthenium (Ru), copper (Cu), or molybdenum (Mo). A lower surface of the bit line contact DC may be positioned at a level lower than that of the upper surface of the substrate 101, and may be positioned at a level higher than the upper surface of the word line WL. The bit line contact DC may be spaced apart from the plurality of conductive pads 130 and/or the storage node contact 160 by the spacer structures SS.

In an example embodiment, the bit line contact DC may include a lower portion DC_LP and an upper portion DC_UP disposed on the lower portion DC_LP. The lower portion DC_LP and the upper portion DC_UP of the bit line contact DC may be integrally, e.g., seamlessly as a single unit manufactured of a same material, connected and may include a metal material.

The contact barrier layer DCB may be disposed between the metal-semiconductor compound pattern 110 and the bit line contact DC to, e.g., completely, separate the metal-semiconductor compound pattern 110 and the bit line contact DC from each other. The contact barrier layer DCB may prevent impurities in the substrate 101 from diffusing into the bit line contact DC. The contact barrier layer DCB may include metal nitride, e.g., at least one of titanium nitride (TiN), tantalum nitride (TaN), and tungsten nitride (WN).

The contact barrier layer DCB may cover at least a portion of the bit line contact DC. In an example embodiment, the contact barrier layer DCB may, e.g., continuously, cover bottom and side surfaces of the lower portion DC_LP of the bit line contact DC, but may not cover the upper portion DC_UP of the bit line contact DC. That is, the contact barrier layer DCB may cover only a portion of the side surface of the bit line contact DC in the bit line contact hole DCH, e.g., the contact barrier layer DCB may cover only the side surface of the lower portion DC_LP of the entire side surface of the bit line contact DC. This may be because, as illustrated in FIG. 8D, a height of an upper end of the contact barrier layer DCB may be adjusted by removing a portion of a preliminary contact barrier layer DCB' conformally formed in the bit line contact hole DCH. In the present disclosure, the 'upper end' may refer to a portion farthest from the substrate 101 of the corresponding component.

As the height of the upper end of the contact barrier layer DCB is adjusted before a patterning process for forming the bit line BL, process difficulty of the patterning process may be reduced. This may be because, during the patterning process, the bit line contact DC and the contact barrier layer DCB are not simultaneously etched but only the bit line contact DC may be etched.

Since the contact barrier layer DCB has lower etch selectivity compared to the bit line contact DC under a specific etching condition, the difficulty of the process of selectively removing the contact barrier layer DCB, without removing other components, may be relatively high. Accordingly, as the height of the upper end of the contact barrier layer DCB is reduced before the patterning process, the patterning process may be performed, while minimizing the loss of other components, e.g., the bit line capping pattern BC or the buffer layer 135. Accordingly, the semiconductor device 100 having improved productivity may be provided.

As the height of the upper end of the contact barrier layer DCB is relatively lowered before the patterning process for forming the bit line BL, the portion of the bit line contact DC formed through the subsequent process may be relatively increased. In an example embodiment, the bit line contact DC portion may correspond to the upper portion DC_UP. Since the bit line contact DC has lower resistivity than the contact barrier layer DCB, resistance of the bit line contact DC may decrease as the upper portion DC_UP in the bit line contact hole DCH relatively increases. Accordingly, the semiconductor device 100 having improved electrical characteristics may be provided.

Referring to FIGS. 2 and 3, the lower portion DC_LP may have a first width W1 in the direction (e.g., the X-direction) in which the word line WL extends, and the upper portion DC_UP may have a second width W2 in the direction (e.g., the X-direction) in which the word line WL extends. In the present disclosure, 'width' refers to a maximum width or an average width of the corresponding portion. The first width W1 may be greater than the second width W2. This is because the upper portion DC_UP is partially removed and the lower portion DC_LP is not removed through the patterning process for forming the bit line BL and the bit line contact DC.

The lower portion DC_LP may have a third width W3 in the direction (e.g., the Y-direction) in which the bit line BL extends, and the upper portion DC_UP may have a fourth width WR in the direction (e.g., the Y-direction) in which the bit line BL extends. For example, the third width W3 may be smaller than the fourth width W4. This is because the upper portion DC_UP fills the bit line contact hole DCH on the lower portion DC_LP and the contact barrier layer DCB as the height of the upper end of the contact barrier layer DCB decreases.

In an example embodiment, the first width W1 and the third width W3 may be substantially equal. However, in some embodiments, when the bit line contact hole DCH is not circular in a plan view, the first width W1 and the third width W3 may be different from each other. In an example embodiment, the second width W2 may be smaller than the fourth width W4.

An upper end of the contact barrier layer DCB may be positioned at a level lower than that of the upper surface of each of the plurality of conductive pads 130. The contact barrier layer DCB may be disposed to be spaced apart from the plurality of conductive pads 130. The upper end of the contact barrier layer DCB may be positioned at a level lower than a lower end of the storage node contact 160. This is because a process of adjusting the upper end of the contact barrier layer DCB is performed before the patterning process for forming the bit line BL.

At least a portion of the upper surface of the contact barrier layer DCB may be covered by the upper portion DC_UP of the bit line contact DC, and the remaining portion of the upper surface of the contact barrier layer DCB may be covered by an upper spacer structure US, among the spacer structures SS.

The spacer structures SS may separate the bit line contact DC, the plurality of conductive pads 130, and the storage node contact 160. The spacer structures SS may include a lower spacer structure LS surrounding a portion of the side surface of the bit line contact DC and the upper spacer structure US disposed on both sidewalls of each of the bit line structure BLS and extending in one direction, e.g., the Y-direction.

The lower spacer structure LS may cover at least a portion of a sidewall of the bit line contact hole DCH. The lower spacer structure LS may separate the bit line contact DC from the plurality of conductive pads 130. The lower spacer structure LS may surround an outer surface of the contact barrier layer DCB. The lower spacer structure LS may include a portion extending from the outer surface of the contact barrier layer DCB along the outer surface of the upper portion DC_UP of the bit line contact DC. The lower spacer structure LS may have a first upper surface coplanar, e.g., coextensive or continuous, with the upper surface of the contact barrier layer DCB (left side of FIG. 2), and a second upper surface positioned at a level higher than the first upper surface and coplanar with the upper surface of the buffer layer 135 (right side of FIG. 2). The lower spacer structure LS may include an insulating material, e.g., silicon oxide, silicon nitride, silicon oxynitride, a low-k material, or combinations thereof. In an example embodiment, the lower spacer structure LS may include a first lower spacer 151 and a second lower spacer 152 surrounding an outer surface and/or a bottom surface of the first lower spacer 151.

The upper spacer structure US may separate the storage node contact 160 from the bit line structure BLS. The upper spacer structure US may be disposed to extend along sidewalls of the bit line BL and sidewalls of the bit line capping pattern BC. A pair of upper spacer structures US disposed on both, e.g., opposite, sides of one bit line structure BLS may be asymmetrical with respect to the bit line structure BLS. The asymmetric shape may be formed by the capping insulating layer 180. The upper spacer structure US may include an insulating material, e.g., silicon oxide or silicon nitride. In the example embodiment, the upper spacer structure US is illustrated as a single layer, but the material and the number of layers of the upper spacer structure US are not limited thereto and may be changed to have various shapes.

The outer surface of the lower portion DC_LP of the bit line contact DC is surrounded by the contact barrier layer DCB, and the outer surface of the upper portion DC_UP of the bit line contact DC may be surrounded by the upper spacer structure US.

In an example embodiment, the semiconductor device 100 may further include an insulating fence. The insulating fence may be disposed to be spaced apart from each other in one direction, e.g., the Y-direction, between the plurality of bit line structures BLS. The insulating fence may overlap the word line structures WLS in a plan view. The insulating fence may include, e.g., silicon nitride.

The storage node contact 160 may be electrically connected to a region of the active region ACT, e.g., the second impurity region 105b. In an example embodiment, the storage node contact 160 may pass through the buffer layer 135 to contact the plurality of conductive pads 130 and may be electrically connected to the second impurity region 105b through the plurality of conductive pads 130. The storage node contact 160 may electrically connect the capacitor structure CAP to the second impurity region 105b.

In an example embodiment, there may be a plurality of storage node contacts 160. As illustrated in FIG. 1, in a plan view, each of the storage node contacts 160 may be disposed between adjacent bit line structures BLS in the X-direction, e.g., between the spacer structures SS on both sides of the bit line structures BLS. In a plan view, each of the storage node contacts 160 may be disposed between the word line structures WLS and between the bit line structures BLS. Each of the storage node contacts 160 may fill a space defined by the bit line structures BLS adjacent in the X-direction and the insulating fence adjacent in the Y-direction. The storage node contacts 160 may be arranged in columns and rows in the X-direction and the Y-direction.

The storage node contact 160 may be formed of a conductive material and may include, e.g., at least one of polycrystalline silicon (Si), titanium (Ti), titanium nitride (TiN), tantalum (Ta), tantalum nitride (TaN), tungsten (W), tungsten nitride (WN), and aluminum (Al). In an example embodiment, the storage node contact 160 may include multiple layers.

A lower end of the storage node contact 160 may be positioned at a level higher than the lower surface of the bit line contact DC. The storage node contact 160 may be insulated from the bit line contact DC by the spacer structure SS.

In an example embodiment, the semiconductor device 100 may further include a metal-semiconductor layer 165 disposed between the storage node contact 160 and the landing pad LP. The metal-semiconductor layer 165 may cover an upper surface of the storage node contact 160. The metal-semiconductor layer 165 may be, e.g., a layer in which a portion of the storage node contact 160 is silicided. For example, the metal-semiconductor layer 165 may include cobalt silicide (CoSi), titanium silicide (TiSi), nickel silicide (NiSi), tungsten silicide (WSi), or other metal silicide. However, in some embodiments, the metal-semiconductor layer 165 may be omitted.

The landing pad LP may electrically connect the storage node contact 160 to the capacitor structure CAP. The landing pad LP may be disposed between the pair of bit line structures BLS and on the storage node contact 160. The landing pad LP may cover an upper surface of the metal-semiconductor layer 165. The landing pad LP may contact sidewalls of the spacer structures SS. In an example embodiment, the upper spacer structure US may extend from between the bit line structure BLS and the storage node contact 160 to between the bit line structure BLS and the landing pad LP. The landing pad LP may pass through the capping insulating layer 180 and may be in contact with the capping insulating layer 180.

In an example embodiment, there may be a plurality of landing pads LP, and the plurality of landing pads LP may be arranged in a lattice pattern forming a hexagonal or honeycomb shape. The arrangement of the plurality of landing pads LP may correspond to the arrangement of the capacitor structures CAP.

In an example embodiment, the landing pad LP may have a double-layer structure including a conductive layer and a barrier layer covering the lower surface and side surfaces of the conductive layer. The conductive layer may include at least one of a conductive material, e.g., polycrystalline silicon (Si), titanium (Ti), tantalum (Ta), tungsten (W), and aluminum (Al), and the barrier layer may include a metal nitride, e.g., at least one of titanium nitride (TiN), tantalum nitride (TaN), and tungsten nitride (WN). However, the number and shape of the landing pad LP may be variously changed according to embodiments.

The capping insulating layer 180 may be disposed on the bit line structure BLS. The capping insulating layer 180 may be disposed to contact the bit line structure BLS, the spacer structures SS, and the landing pad LP. In an example embodiment, the capping insulating layer 180 may be disposed between the plurality of landing pads LP. The capping insulating layer 180 may have a lower end in contact with upper surfaces of the spacer structures SS.

The capacitor structure CAP may be disposed on the bit line structure BLS to contact the landing pad LP. The capacitor structure CAP may include a lower electrode 192, a capacitor dielectric layer 194, and an upper electrode 196. The lower electrode 192 and the upper electrode 196 may include at least one of, e.g., a doped semiconductor, a metal nitride, a metal, and a metal oxide. The lower electrode 192 and the upper electrode 196 may include, e.g., at least one of polycrystalline silicon, titanium nitride (TiN), tungsten (W), titanium (Ti), ruthenium (Ru), and tungsten nitride (WN). For example, the capacitor dielectric layer 194 may include at least one of high-k materials, e.g., zirconium oxide ($ZrO_2$), aluminum oxide ($Al_2O_3$), or hafnium oxide ($Hf_2O_3$). In FIG. 2, the capacitor structure CAP is illustrated to have a pillar shape, but embodiments are not limited thereto, e.g., and the capacitor structure CAP may have a cylindrical shape. However, in some embodiments, the capacitor structure CAP may be omitted and a separate information storage structure may be included. In the present disclosure, the term 'information storage structure' refers to including a capacitor structure.

Next, modified examples of a semiconductor device will be described with reference to FIGS. 4A to 4F. FIGS. 4A to 4F correspond to the enlarged view of region 'A' of FIG. 2.

Figure 4A:
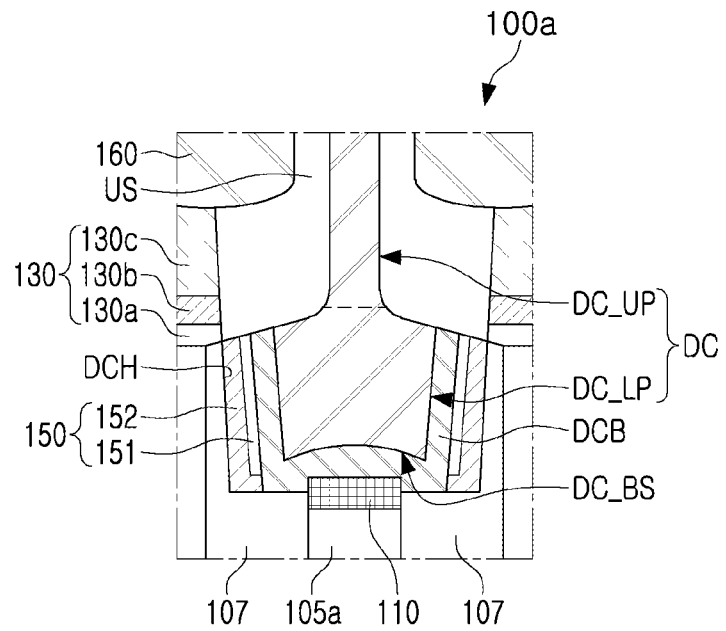
FIG. 4A is a partially enlarged cross-sectional view of a semiconductor device according to example embodiments.

FIG. 4A is a partially enlarged cross-sectional view of a semiconductor device 100a according to example embodiments.

Referring to FIG. 4A, the lower surface DC_BS of the bit line contact DC may be disposed such that a central portion of the lower surface DC_BS is positioned at a level higher than an edge portion of the lower surface DC_BS. That is, the lower surface DC_BS of the bit line contact DC may have a convex shape in a direction oriented away from the substrate 101. This is because, unlike that of FIG. 3, the metal-semiconductor compound pattern 110 has an upper surface at a level higher than upper surfaces of the adjacent device separation layers 107. Accordingly, a lower end portion of the contact barrier layer DCB and the lower surface DC_BS of the bit line contact DC, which are formed through a subsequent process, may have a convex shape.

Figure 4B:
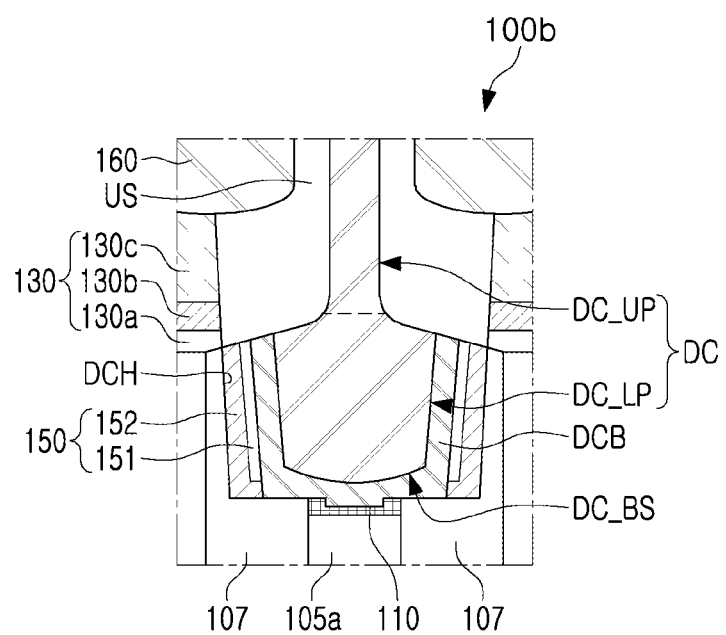
FIG. 4B is a partially enlarged cross-sectional view of a semiconductor device according to example embodiments.

FIG. 4B is a partially enlarged cross-sectional view of a semiconductor device 100b according to example embodiments.

Referring to FIG. 4B, the lower surface DC_BS of the bit line contact DC may be disposed such that a central portion of the lower surface DC_BS is positioned at a level lower than that of the edge portion of the lower surface DC_BS. That is, the lower surface DC_BS of the bit line contact DC may have a convex shape in a direction oriented toward the substrate 101. This is because a portion of the upper portion of the metal-semiconductor compound pattern 110, e.g., a central portion, is removed by a subsequent process, e.g., a cleaning process after formation of the metal-semiconductor compound pattern 110. Accordingly, the lower end portion of the contact barrier layer DCB and the lower surface DC_BS of the bit line contact DC, which are formed through a subsequent process, may have a convex shape.

Figure 4C:
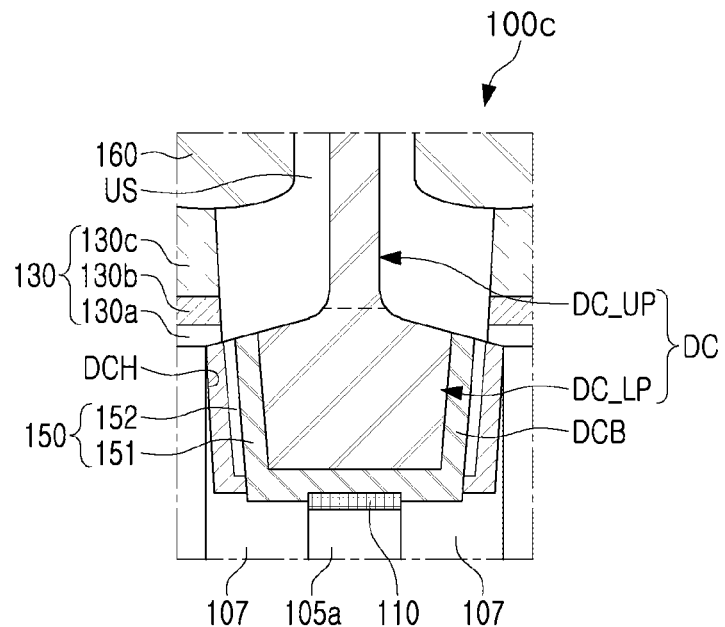
FIG. 4C is a partially enlarged cross-sectional view of a semiconductor device according to example embodiments.

FIG. 4C is a partially enlarged cross-sectional view of a semiconductor device 100c according to example embodiments.

Referring to FIG. 4C, the contact barrier layer DCB may include a portion extending between the metal-semiconductor compound pattern 110 and the device separation layers 107, while covering a portion of the side surface of the metal-semiconductor compound pattern 110. A lower end of the extending portion may be located at a level lower than a lower end of the lower spacer structure LS. This is because, after the metal-semiconductor compound pattern 110 is formed, a portion of the adjacent device separation layers 107 is removed by a subsequent process, e.g., a cleaning process to form an opening and a contact barrier layer DCB is deposited into the opening.

Figure 4D:
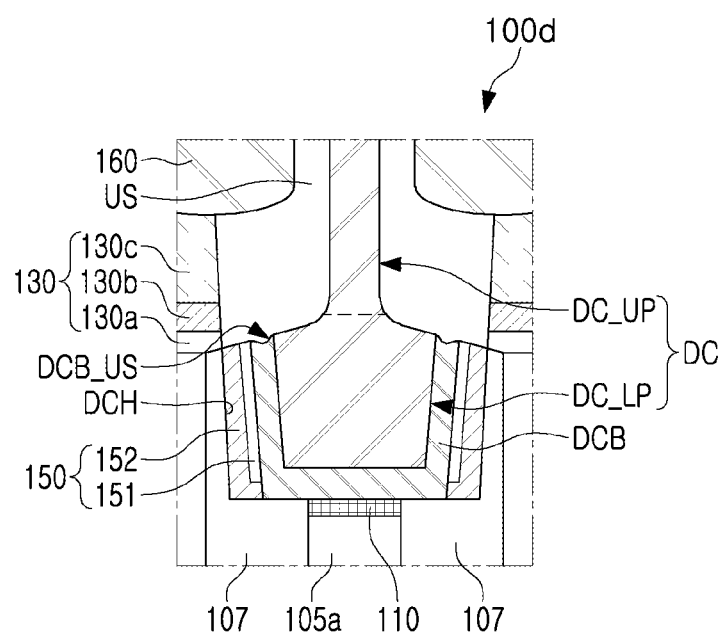
FIG. 4D is a partially enlarged cross-sectional view of a semiconductor device according to example embodiments.

FIG. 4D is a partially enlarged cross-sectional view of a semiconductor device 100d according to example embodiments.

Referring to FIG. 4D, in the contact barrier layer DCB, an upper surface DCB_US of the contact barrier layer DCB adjacent to the outer surface of the contact barrier layer DCB and an upper surface DCB_US of the contact barrier layer DCB adjacent to the inner surface may be positioned at a level higher than the upper surface DCB_US of the contact barrier layer DCB adjacent between the outer surface and the inner surface of the contact barrier layer DCB. That is, an upper portion of the contact barrier layer DCB may have a concave shape as a central portion thereof is partially recessed. This is because an etching process for the contact barrier layer DCB is performed separately from an etching process for the lower spacer structure LS. However, the shape of the upper surface of the contact barrier layer DCB may be variously changed according to process conditions of the etching process for the lower spacer structure LS.

Figure 4E:
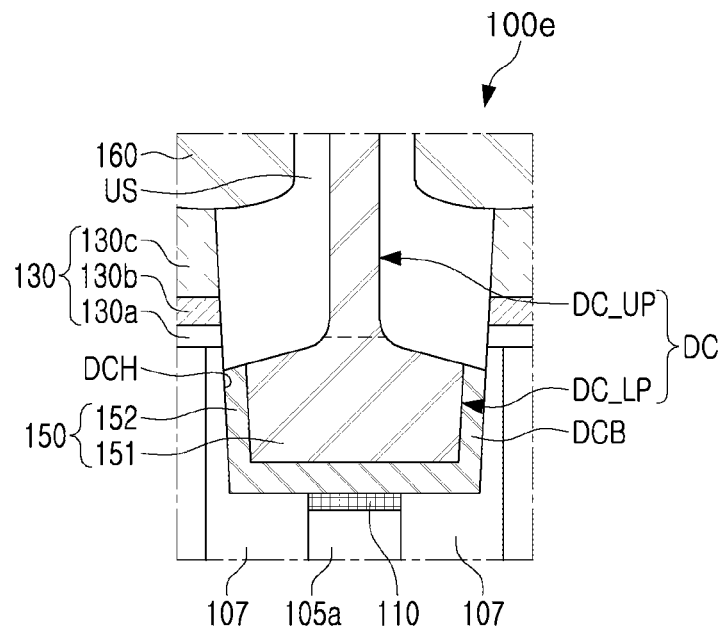
FIG. 4E is a partially enlarged cross-sectional view of a semiconductor device according to example embodiments.

FIG. 4E is a partially enlarged cross-sectional view of a semiconductor device 100e according to example embodiments.

Referring to FIG. 4E, the semiconductor device 100e may not include the lower spacer structure LS. The contact barrier layer DCB may cover a bottom surface of the bit line contact hole DCH and a lower end portion of a sidewall thereof. Accordingly, the contact barrier layer DCB may contact the substrate 101 exposed by the bit line contact hole DCH. In this case, the upper end of the contact barrier layer DCB may be positioned at a level lower than that of the lower surfaces of the plurality of conductive pads 130, and the contact barrier layer DCB may be spaced apart from the plurality of conductive pads 130.

Figure 4F:
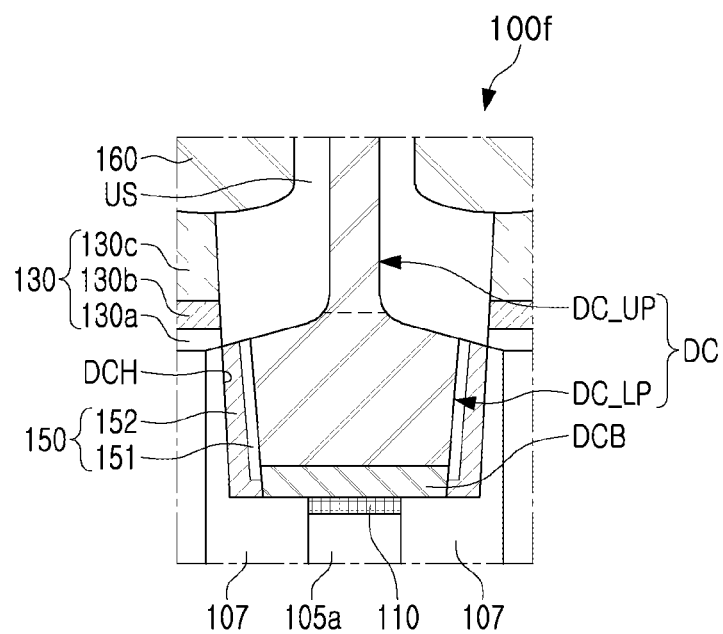
FIG. 4F is a partially enlarged cross-sectional view of a semiconductor device according to example embodiments.

FIG. 4F is a partially enlarged cross-sectional view of a semiconductor device 100f according to example embodiments.

Referring to FIG. 4F, the contact barrier layer DCB may cover the lower surface of the bit line contact DC and may not cover the side surface of the bit line contact DC. The contact barrier layer DCB may be formed to have a minimum volume in the bit line contact hole DCH, while separating the bit line contact DC from the metal-semiconductor compound pattern 110. In this case, since the volume of the bit line contact DC in the bit line contact hole DCH is relatively increased, a semiconductor device having improved electrical characteristics may be provided. In the example embodiment, it is illustrated that the lower spacer structure LS extends from between the outer surface of the contact barrier layer DCB and the sidewall of the bit line contact hole DCH along the sidewall of the bit line contact hole DCH, but, alternatively, the upper surface of the contact barrier layer DCB and the upper surface of the lower spacer structure LS may be coplanar.

Figure 5A:
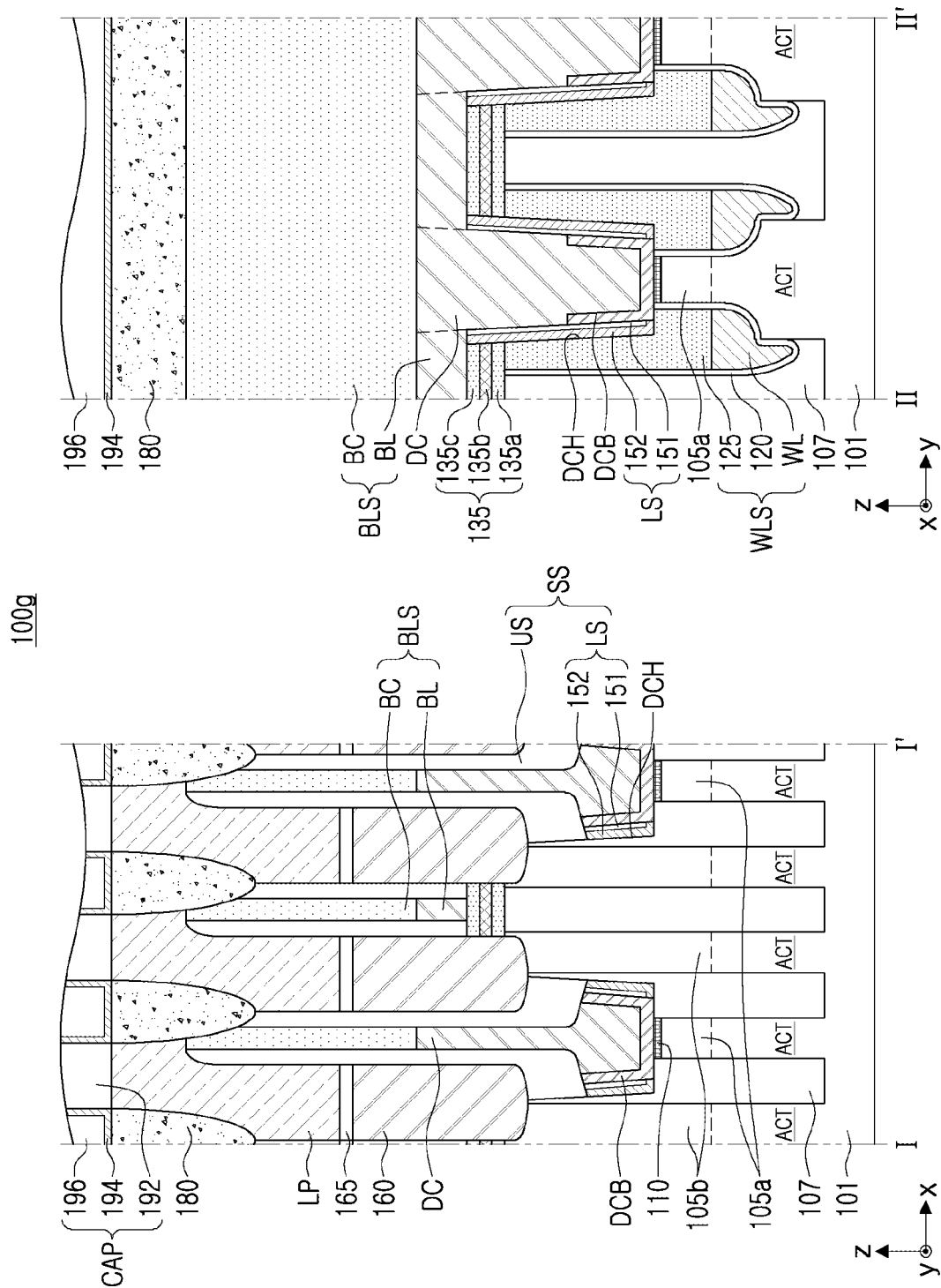
FIGS. 5A and 5B are schematic cross-sectional views of semiconductor devices according to example embodiments.

FIG. 5A is a schematic cross-sectional view of a semiconductor device 100g according to example embodiments. FIG. 5A shows a region corresponding to cross sections taken along lines I-I' and II-II' in FIG. 1A.

Referring to FIG. 5A, the semiconductor device 100g may not include the plurality of conductive pads 130 (refer to FIG. 2) and the insulating pattern 131.

The buffer layer 135 may be disposed between the bit line structure BLS and the substrate 101 and may directly contact the substrate 101. The storage node contact 160 may pass through the buffer layer 135 to directly contact the second impurity region 105b of the substrate 101. The bit line contact DC and the bit line BL may be spaced apart from the storage node contact 160 and the second impurity region 105b by the upper and lower spacer structures US and LS.

Figure 5B:
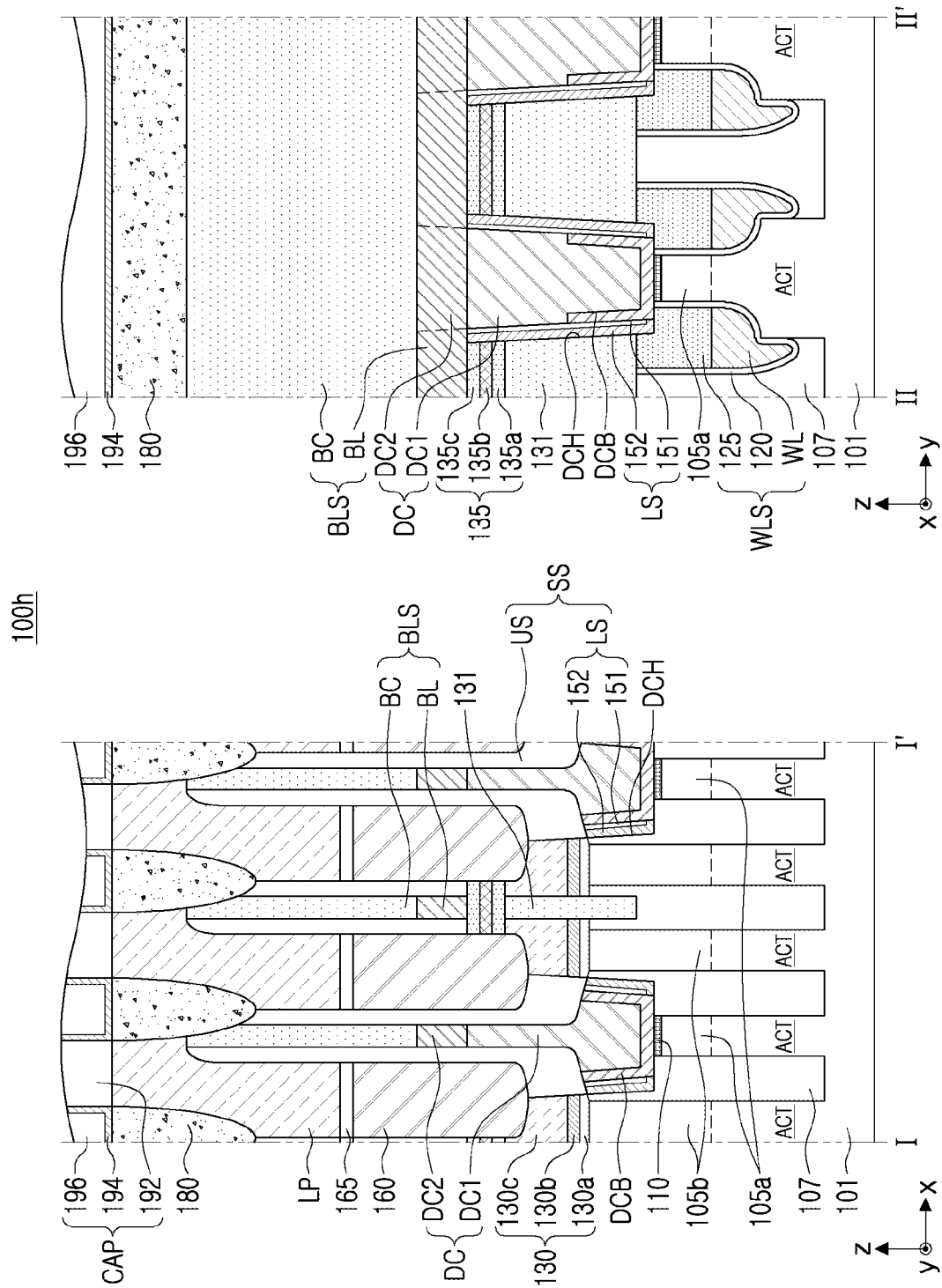

FIG. 5B is a schematic cross-sectional view of a semiconductor device 100h according to example embodiments. FIG. 5B shows a region corresponding to a cross-section taken along lines I-I' and II-II' of FIG. 1A.

Referring to FIG. 5B, the bit line contact DC may include a first bit line contact DC1 and a second bit line contact DC2 on the first bit line contact DC1. In an example embodiment, the first and second bit line contacts DC1 and DC2 may include different metal materials. In some embodiments, even if the first and second bit line contacts DC1 and DC2 include the same metal material, a boundary therebetween may be distinguished as the first and second bit line contacts DC1 and DC2 are formed through separate processes. For example, the first bit line contact DC1 may be formed through a CVD process, and the second bit line contact DC2 may be formed through a PVD process.

For example, as illustrated in FIG. 5B, an interface between the first bit line contact DC1 and the second bit line contact DC2 is shown to be the uppermost portion of the bit line contact hole DCH or the uppermost surface of the buffer layer 135. In another example, the boundary between the first and second bit line contacts DC1 and DC2 may be variously changed according to process conditions.

Figure 6:
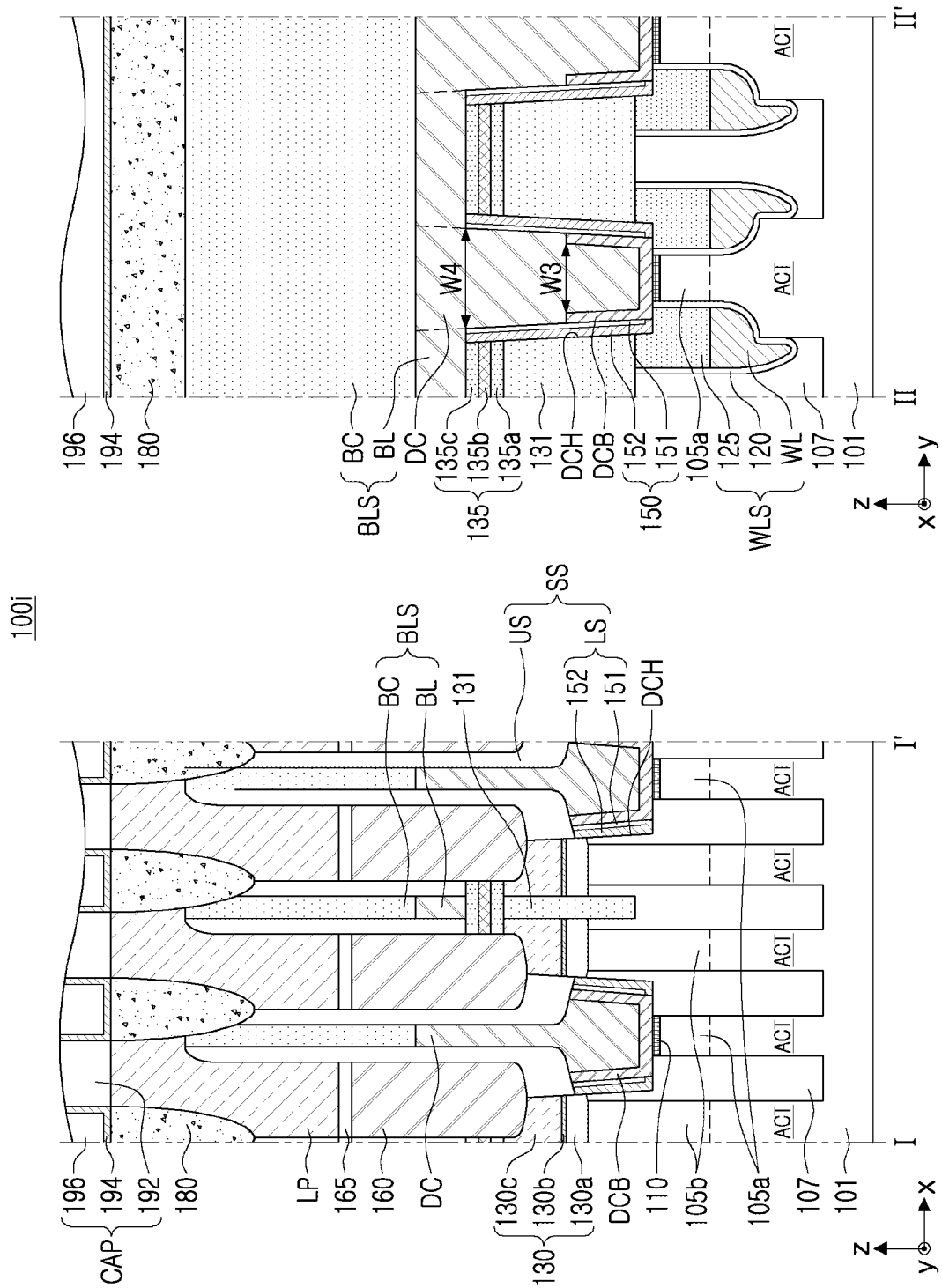
FIG. 6 is a schematic cross-sectional view of a semiconductor device according to example embodiments.

FIG. 6 is a schematic cross-sectional view of a semiconductor device 100i according to example embodiments. FIG. 6 shows a region corresponding to cross-sections taken along lines I-I' and II-IF of FIG. 1A.

Referring to FIG. 6, the plurality of conductive pads 130 may include the semiconductor material layer 130a, the metal-semiconductor layer 130b, and the metal layer 130c sequentially stacked, with the metal-semiconductor layer 130b having a thickness less than the semiconductor material layer 130a and the metal layer 130c. In an example embodiment, an upper end of the contact barrier layer DCB may be positioned at a level lower than that of the upper surface of the semiconductor material layer 130a. However, in consideration of productivity and electrical characteristics of the semiconductor device, the thickness of the plurality of conductive pads 130 and the height of the upper end of the contact barrier layer DCB may be variously changed.

Figure 7A:
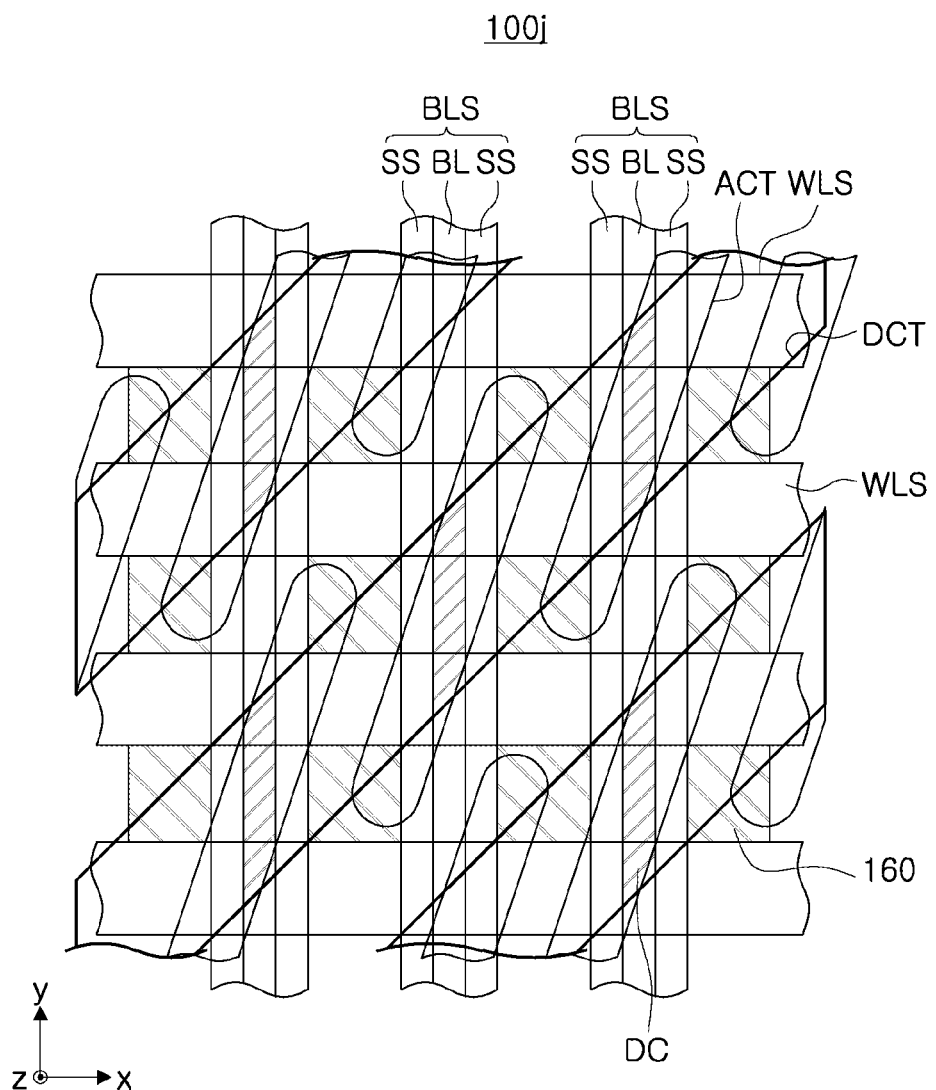
FIG. 7A is a schematic plan view of a semiconductor device according to example embodiments.

FIG. 7A is a schematic plan view of a semiconductor device 100j according to example embodiments.

Referring to FIG. 7A, the bit line contact DC and the contact barrier layer DCB may be disposed in a bit line contact trench DCT, instead of the bit line contact hole DCH. The bit line contact trench DCH may be a line type extending in a direction between the direction (e.g., the X-direction) in which the word line WL extends and the direction (e.g., the Y-direction) in which the bit line BL extends. The bit line contact trench DCH may expose the first impurity region 105a (refer to FIG. 2). The contact barrier layer DCB may cover a portion of a side surface and a bottom surface of the bit line contact DC in the bit line contact trench DCT.

Figure 7B:
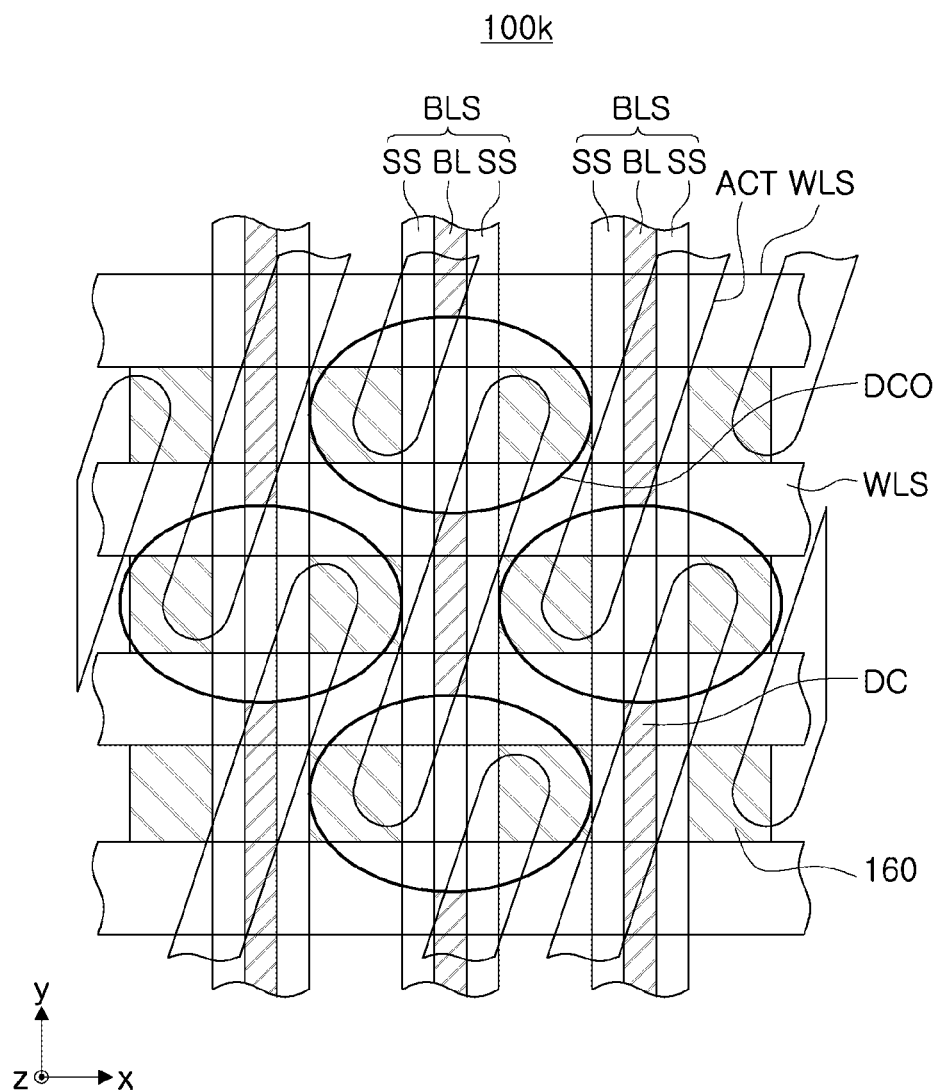
FIG. 7B is a schematic plan view of a semiconductor device according to example embodiments.

FIG. 7B is a schematic plan view of a semiconductor device 100k according to example embodiments.

Referring to FIG. 7B, the bit line contact DC and the contact barrier layer DCB may be disposed in a bit line contact opening DCO, instead of the bit line contact hole DCH. The bit line contact opening DCO may be a reverse type opening passing through the remaining portion except for the circular pattern using a circular pattern mask. The bit line contact opening DCO may expose the first impurity region 105a (refer to FIG. 2). The contact barrier layer DCB may cover a portion of a side surface and a bottom surface of the bit line contact DC in the bit line contact opening DCO.

FIGS. 8A to 8G are schematic cross-sectional views illustrating stages in a method of manufacturing a semiconductor device according to example embodiments.

Figure 8A:
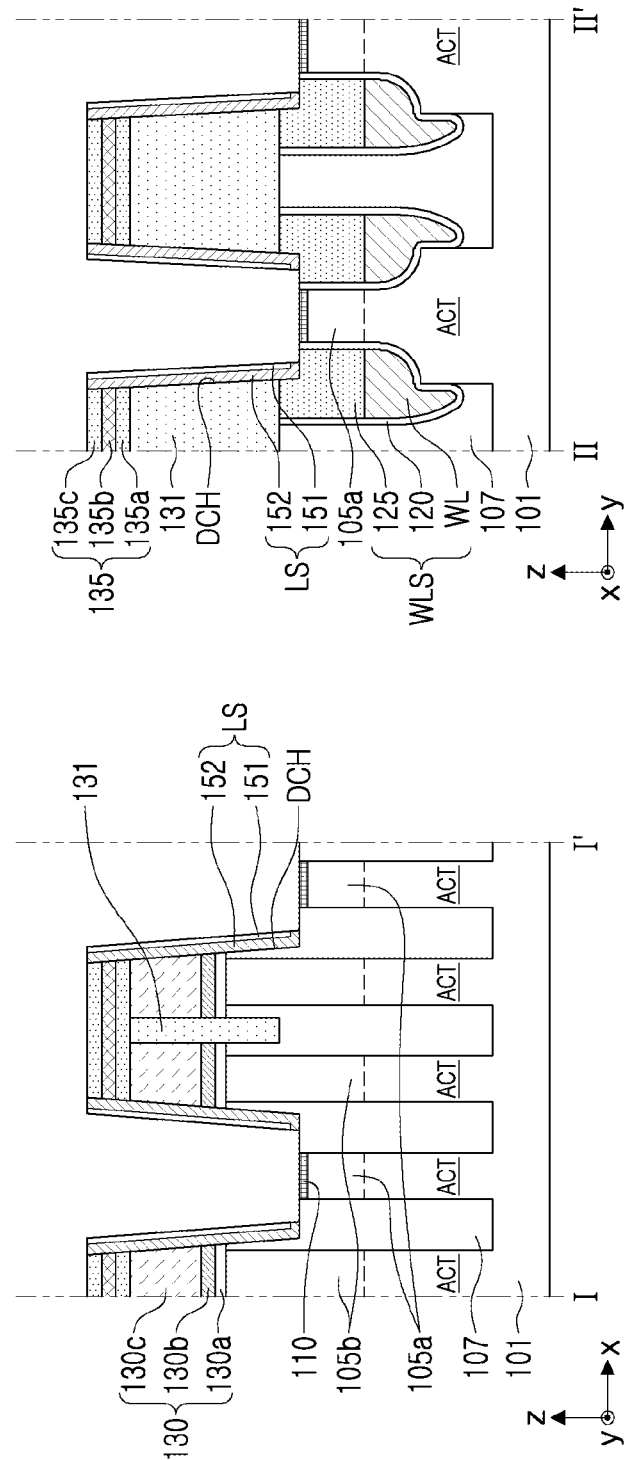
FIGS. 8A to 8G are schematic cross-sectional views illustrating a method of manufacturing a semiconductor device according to example embodiments.

Referring to FIG. 8A, the device separation layers 107 defining the active region ACT may be formed in the substrate 101, the word line structure WLS may be formed in the substrate 101, the plurality of conductive pads 130 and the insulating pattern 131 may be formed on the substrate 101, the buffer layer 135 may be formed, the bit line contact hole DCH may be formed, and the internal spacer structure LS may be formed.

First, according to a shallow trench isolation (STI) process, the substrate 101 may be anisotropically etched to form trenches, insulating materials may be deposited in the trenches, and then planarization may be performed thereon to form the device separation layers 107. Impurities may be implanted into the substrate 101 before formation of the device separation layers 107 to form the impurity regions 105a and 105b. However, in some embodiments, the impurity regions 105a and 105b may be formed after the formation of the device separation layers 107 or in another process.

Next, the substrate 101 may be anisotropically etched to form gate trenches in which the word lines WL are disposed. The gate trenches may extend in the X-direction and may cross the active region ACT and the device separation layers 107. The gate dielectric layer 120, the word line WL, and the buried insulating layer 125 may be sequentially formed in the gate trenches. The gate dielectric layer 120 may be formed to have a substantially uniform thickness on at least a portion of inner walls and bottom surfaces of the gate trenches. The gate dielectric layer 120 may be formed by an oxidation process of the active region ACT or a deposition process of a dielectric material. The word lines WL may be formed by depositing a conductive material in the gate trenches and recessing to a predetermined depth from the top. The buried insulating layer 125 may be formed by depositing an insulating material to fill the remaining portion of the gate trench and then performing a planarization process. Accordingly, the word line structures WLS may be formed.

Next, a conductive material layer may be formed on the substrate 101, and a portion of the conductive material layer may be etched to form a trench passing through the conductive material layer and the plurality of conductive pads 130. The insulating pattern 131 may be formed by filling the trench with an insulating material and performing a planarization process. In an example embodiment, the conductive material layer may include a plurality of material layers, e.g., a semiconductor layer, a silicide layer, and a metal layer being sequentially stacked, but the number, thickness, and material of the conductive material layer may be variously changed.

Next, the buffer layer 135 may be formed on the plurality of conductive pads 130 and the insulating pattern 131. The buffer layer 135 may be formed by sequentially depositing the first to third buffer layers 135a, 135b, and 135c on the upper surfaces of the plurality of conductive pads 130 and the insulating pattern 131 that have been subjected to the planarization process. The first to third buffer layers 135a, 135b, and 135c may include different insulating materials. For example, the first buffer layer 135a may include silicon oxide, the second buffer layer 135b may include silicon nitride, and the third buffer layer 135c may include silicon oxynitride. That is, the number, thickness, and material of the buffer layer 135 may be variously changed.

Thereafter, the buffer layer 135, the plurality of conductive pads 130, and the insulating pattern 131 may be etched to form a bit line contact hole DCH exposing the substrate 101. Referring to FIG. 1A, the bit line contact hole DCH may have a circular hole shape and may be disposed to overlap the center of the active region ACT.

The lower spacer structure LS surrounding a sidewall of the bit line contact hole DCH may be formed. The lower spacer structure LS may be formed by A depositing the second lower spacer 152 conformally covering sidewalls and a bottom surface of the bit line contact hole DCH, depositing the first lower spacer 151 covering the second lower spacer 152, and then removing portions of the first and second lower spacers 151 and 152 covering the bottom surface of the bit line contact hole DCH through an anisotropic etching process. The metal-semiconductor compound pattern 110 may be formed on the active region ACT exposed by the bit line contact hole DCH. The metal-semiconductor compound pattern 110 may be formed by depositing a metal material layer covering the exposed active region ACT and performing a silicide process, e.g., an annealing process. The metal-semiconductor compound pattern 110 may form an ohmic contact between the bit line contact DC and the substrate 101 to improve electrical characteristics of the semiconductor device.

Figure 8B:
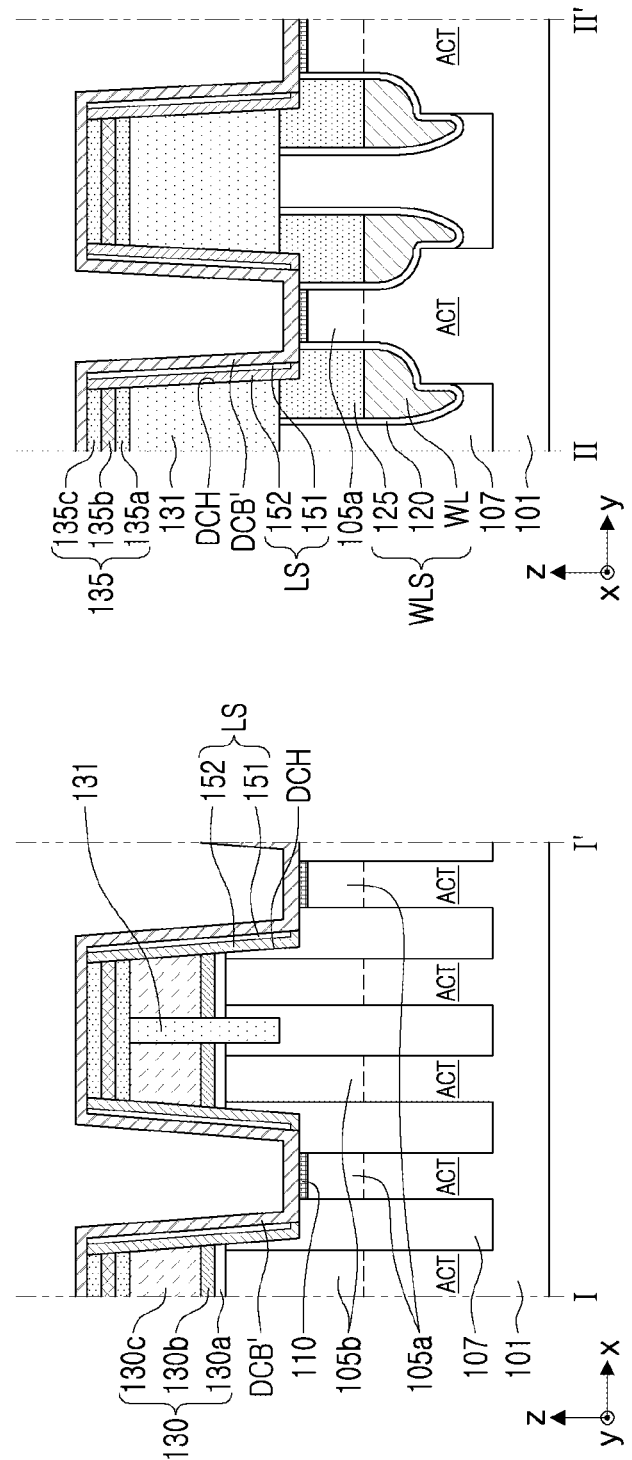

Referring to FIG. 8B, a preliminary contact barrier layer DCB' may be formed. The preliminary contact barrier layer DCB' may be formed by performing a deposition process to conformally cover the lower spacer structure LS in the bit line contact hole DCH, the metal-semiconductor compound pattern 110, and the buffer layer 135.

The preliminary contact barrier layer DCB' may include a metal nitride, e.g., at least one of titanium nitride (TiN), tantalum nitride (TaN), and tungsten nitride (WN). The preliminary contact barrier layer DCB' may serve to prevent impurities in the second impurity region 105b from being diffused.

Figure 8C:
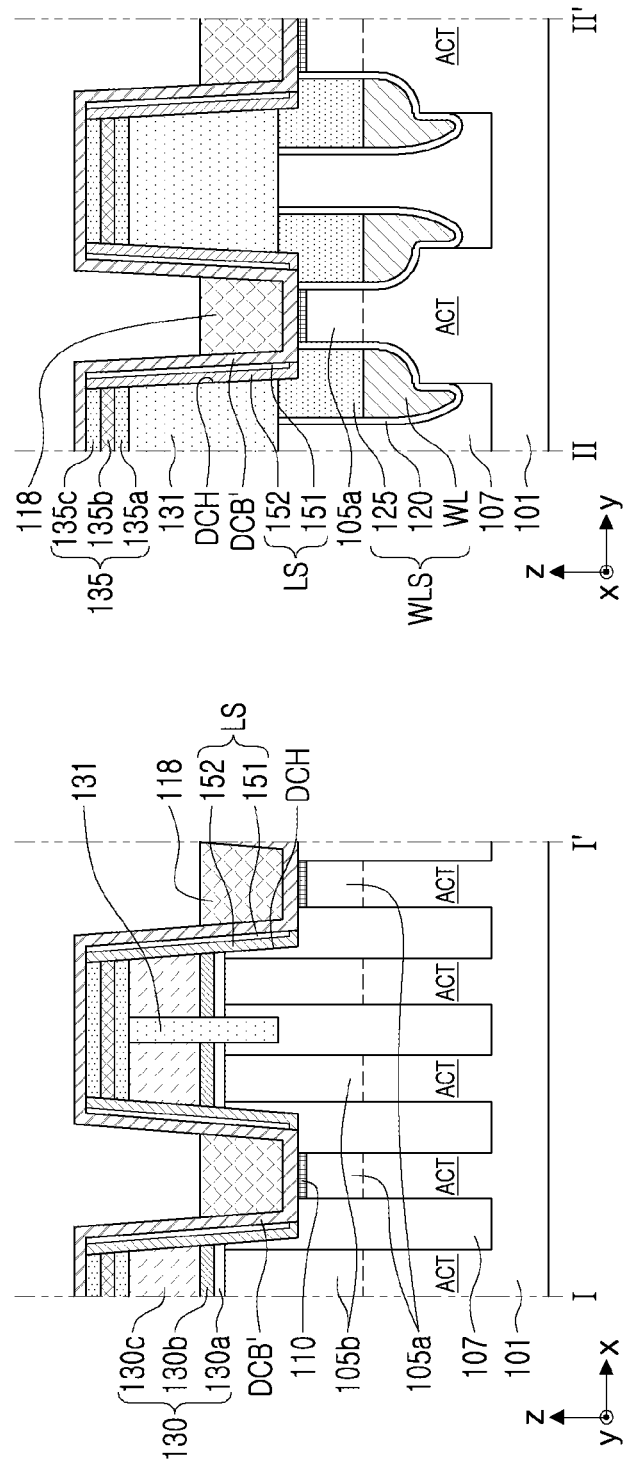
Figure 8D:
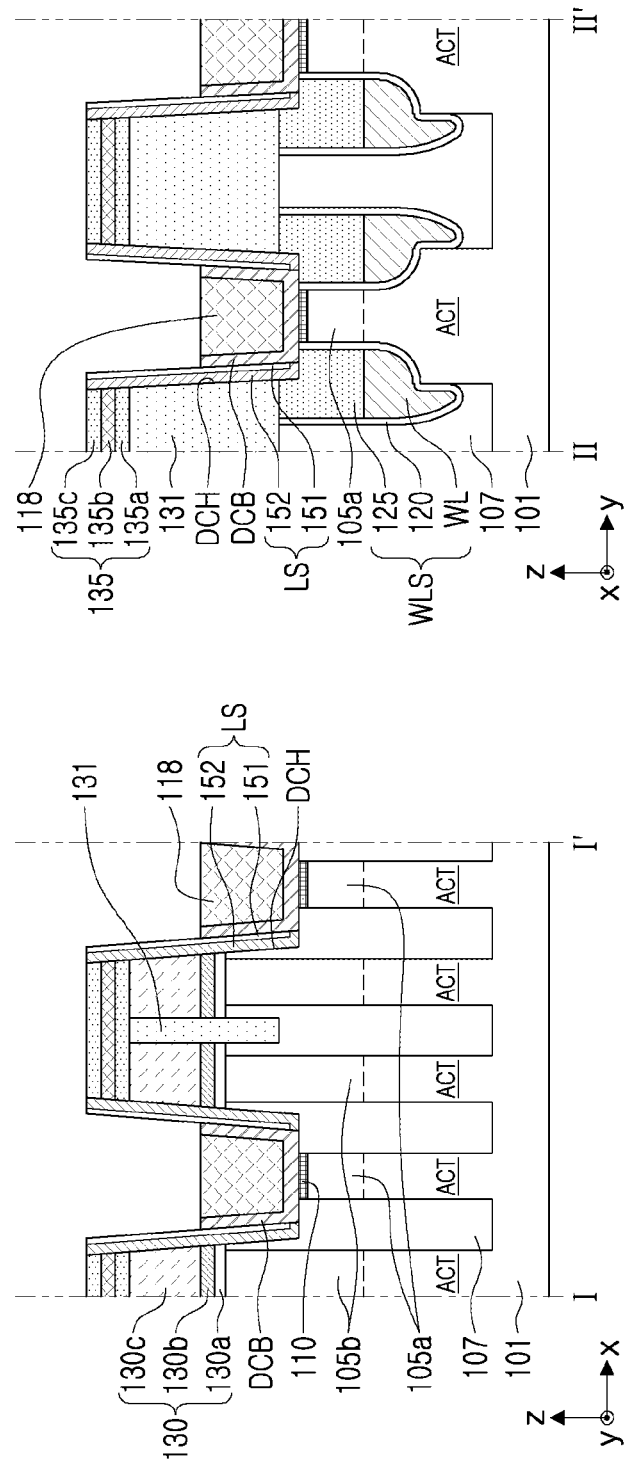

Referring to FIG. 8C, a coating layer 118 may be formed. The bit line contact hole DCH may be filled with a coating material and an etch-back process may be performed to form the coating layer 118 filling to a predetermined depth in the bit line contact hole DCH.

Although an upper surface of the coating layer 118 is illustrated to be positioned on substantially the same level as an upper surface of the metal-semiconductor layer 130*b*, alternatively, a height of an upper end of a contact barrier layer DCB (refer to FIG. 7D) formed through a subsequent process may be adjusted by variously adjusting a height of the upper surface of the coating layer 118. The coating layer 118 may include, e.g., spin on hardmask (SOH).

Referring to FIG. 8D, the contact barrier layer DCB may be formed. An etching process may be performed to remove a portion of the preliminary contact barrier layer DCB' formed on the buffer layer 135 and a portion of the preliminary contact barrier layer DCB' formed on the sidewall of the lower spacer structure LS to form the contact barrier layer DCB.

In the etching process, due to the coating layer 118, the contact barrier layer DCB may be formed to have an upper end substantially on the same level as the upper surface of the coating layer 118. In an example embodiment, the etching process may be a wet etching process, and in this case, the upper surface of the contact barrier layer DCB may have a shape partially recessed downwardly as illustrated in FIG. 4E. However, the upper surface of the contact barrier layer DCB may have a different upper surface shape as a portion of the contact barrier layer DCB is removed together with the lower spacer structure LS in a subsequent process according to embodiments.

Figure 8E:
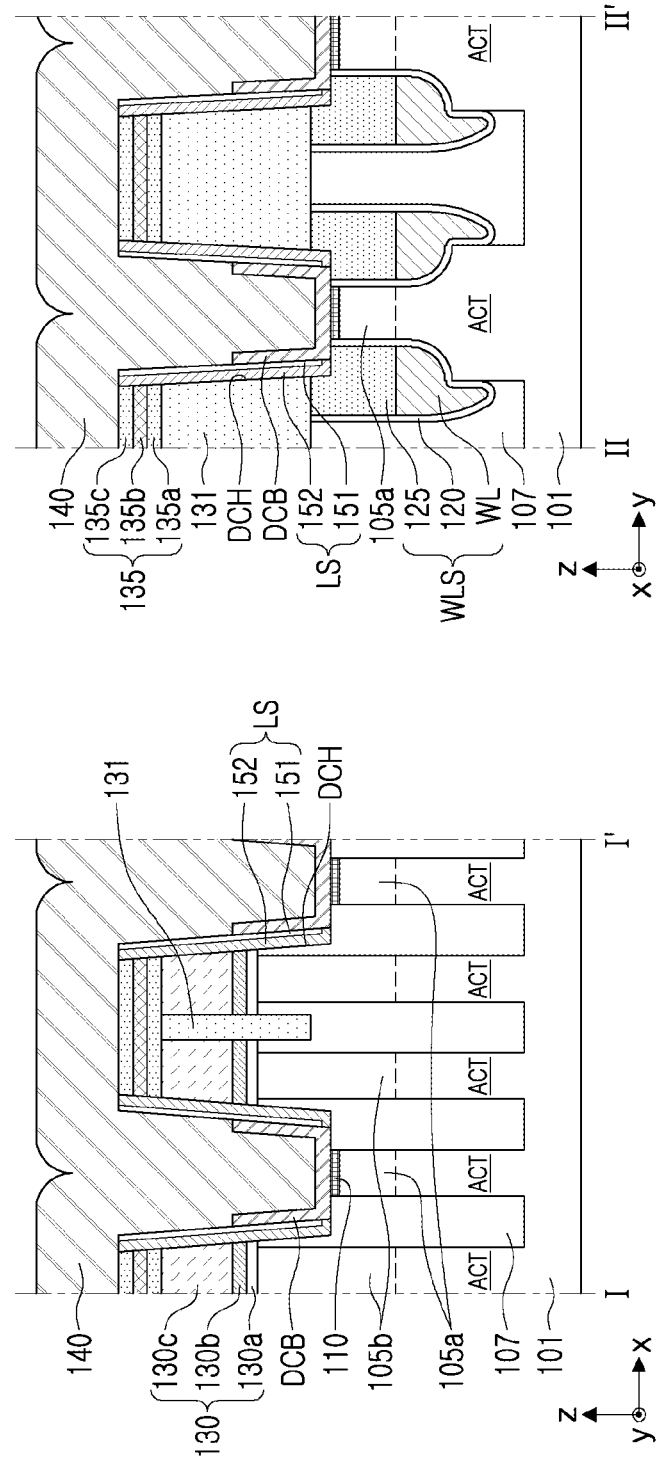

Referring to FIG. 8E, a preliminary bit line contact and a preliminary bit line 140 may be formed. A conductive material may be formed to cover the inside of the bit line contact hole DCH and the buffer layer 135 through a deposition process to form the preliminary bit line contact and the preliminary bit line 140. The conductive material may be a metal material, e.g., tungsten (W), ruthenium (Ru), copper (Cu), or molybdenum (Mo).

The preliminary bit line contact may refer to a portion of the conductive material formed on the bit line contact hole DCH, and the preliminary bit line may refer to a portion of the conductive material formed on the buffer layer 135. As illustrated in FIG. 8E, the preliminary bit line contact and the preliminary bit line 140 may be integrally formed, but alternatively, the preliminary bit line contact and the preliminary bit line 140 may be separately formed through a planarization process and an additional deposition process.

Figure 8F:
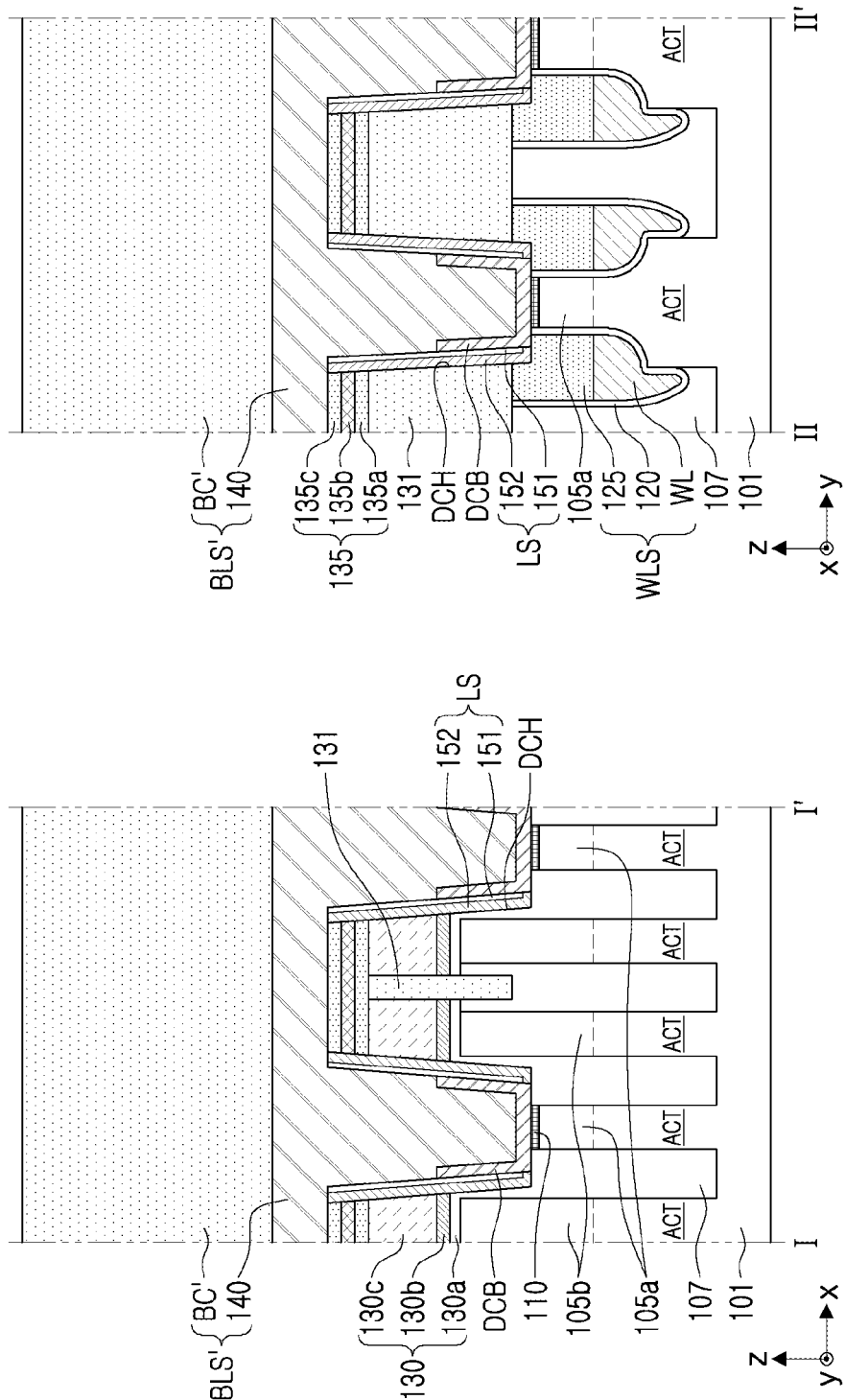

Referring to FIG. 8F, a planarization process may be performed on the preliminary bit line contact and the preliminary bit line 140, and an insulating material may be deposited on the preliminary bit line contact and the preliminary bit line 140 to form a preliminary bit line capping layer BC'. The insulating material layer may include, e.g., silicon nitride. In addition, the insulating material layer may be formed of a plurality of layers. Accordingly, a preliminary bit line structure BLS' including the preliminary bit line and the preliminary bit line capping layer BC' may be formed.

Figure 8G:
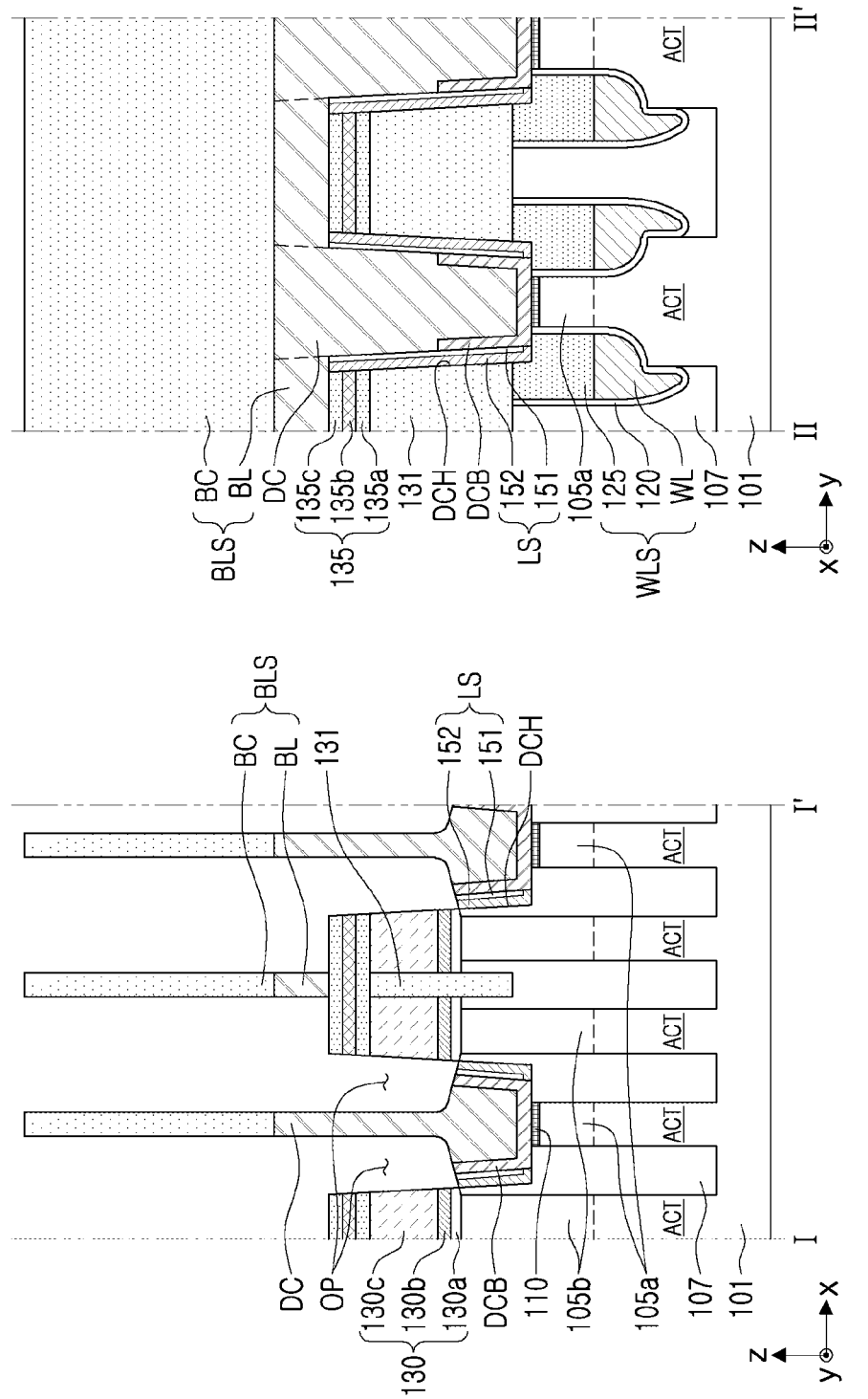

Referring to FIG. 8G, a bit line structure BLS may be formed. By forming an opening OP passing through the preliminary bit line structure BLS', the bit line structure BLS including the bit line BL and the bit line capping pattern BC and the bit line contact DC may be formed.

As the upper end of the contact barrier layer DCB is positioned at a relatively low height before the etching process for forming the opening OP, the process difficulty may be relatively reduced. That is, in the etching process, since only the bit line contact DC needs to be etched (i.e., without simultaneously etching both the bit line contact DC and the contact barrier layer DCB), the process difficulty may be improved in terms of etching materials and etching selectivity. Accordingly, the semiconductor device 100 having improved productivity may be provided.

Next, referring to FIG. 2, the upper spacer structure US may be formed in the opening OP, the storage node contact 160 may be formed, the landing pad LP may be formed, and the capacitor structure CAP may be formed.

The upper spacer structure US may cover an inner wall and a bottom surface of the opening OP. Accordingly, the upper spacer structure US may cover sidewalls of the bit line structure BLS, and may cover the bit line contact DC, the contact barrier layer DCB, and the lower spacer structure LS. The upper spacer structure US may include an insulating material, e.g., silicon oxide, silicon nitride, silicon carbide, or combinations thereof. In an example embodiment, the upper spacer structure US may include a plurality of insulating material layers, and some of the plurality of insulating material layers may be removed through a subsequent process to include an air spacer.

An insulating fence may be formed by forming sacrificial patterns between the bit line structures BLS, etching a portion of the sacrificial patterns, and filling the etched portion with an insulating material, different from the sacrificial patterns, e.g., silicon nitride. The insulating fence may be disposed to overlap the word line structure WLS in the z-direction. The sacrificial patterns and the insulating fence may be alternately disposed in the Y-direction.

An etching process may be performed on a portion of the upper spacer structure US and the sacrificial patterns to form a storage node contact hole. The storage node contact hole may partially remove the buffer layer 135 and the plurality of conductive pads 130 to expose the plurality of conductive pads 130. The storage node contact hole may be filled with a conductive material and an etching process may be performed thereon to form the storage node contact 160. Accordingly, the storage node contact 160 may directly contact the plurality of exposed conductive pads 130. The conductive material may include, e.g., at least one of a doped semiconductor material, a metal, and a metal nitride. In some embodiments, the conductive material may include polycrystalline silicon. Next, a metal-semiconductor layer 165 may be formed on the storage node contact 160. The metal-semiconductor layer 165 may be formed by reacting an upper surface of the storage node contact 160 with a metal material. The reaction may include, e.g., a silicide process.

The landing pad LP may be formed on the metal-semiconductor layer 165. The landing pad LP may extend between the bit line structures BLS, and the landing pads LP connected to the respective storage node contacts 160 may be separated from each other.

The capping insulating layer 180 extending between the landing pads LP and contacting the upper spacer structure US may be formed. Thereafter, a portion of the capping insulating layer 180 may be removed by performing a planarization process and/or an etch-back process, and then, the capacitor structure CAP may be formed on the landing pad LP. Accordingly, the semiconductor device 100 of FIGS. 1 to 3 may be manufactured.

By way of summation and review, in order to manufacture high-performance semiconductor devices, a technology for forming a barrier pattern optimized for separating a bit line and a substrate is required. Therefore, according to embodiments, structures of a bit line contact and a contact barrier layer are optimized, so a semiconductor device having improved electrical characteristics and productivity may be provided.

That is, according to embodiments, a barrier layer may be formed to cover a bottom of the bit line contact, e.g., only on the lower portion of the bit line contact. As such, leveling (i.e., lowering a height of) the barrier layer, before forming the bit line contact, may facilitate formation of the bit line structure. Further, an increased size of an upper portion of the bit line contact may reduce the resistance of the bit line contact.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a substrate including an active region;
a word line structure crossing the active region and extending in a first horizontal direction parallel to a top surface of the substrate;
a bit line structure extending in a second horizontal direction on the substrate, the second horizontal direction being parallel to the top surface of the substrate and intersecting the first horizontal direction;
a bit line contact electrically connecting a first impurity region of the active region to the bit line structure;
a storage node contact on a sidewall of the bit line structure and electrically connected to a second impurity region of the active region; and
a contact barrier layer covering at least a portion of the bit line contact,
wherein:
the bit line contact includes a lower portion having a first width in the first horizontal direction and an upper portion on the lower portion and having a second width in the first horizontal direction,
the first width is greater than the second width, and
the contact barrier layer covers a bottom surface and a side surface of the lower portion, and
wherein the contact barrier layer is disposed in a space between the bottom surface of the lower portion of the bit line contact and an upper surface of the first impurity region of the active region in a vertical direction perpendicular to the top surface of the substrate.

2. The semiconductor device as claimed in claim 1, wherein the lower portion has a third width in the second horizontal direction, the upper portion has a fourth width in the second horizontal direction, and the third width is smaller than the fourth width.

3. The semiconductor device as claimed in claim 2, wherein the first width is equal to the third width, and the second width is smaller than the fourth width.

4. The semiconductor device as claimed in claim 1, wherein the upper portion of the bit line contact covers at least a portion of two upper ends of the contact barrier layer, and wherein the two upper ends are disposed on opposing side surfaces of the lower portion of the bit line contact in the second horizontal direction.

5. The semiconductor device as claimed in claim 1, further comprising an upper spacer structure between the bit line structure and the bit line contact, the upper spacer structure covering at least a portion of an upper surface of the contact barrier layer in the first horizontal direction.

6. The semiconductor device as claimed in claim 5, wherein the upper spacer structure separates the storage node contact from the contact barrier layer.

7. The semiconductor device as claimed in claim 1, wherein an upper end of the contact barrier layer is at a level lower than a level of a lower end of the storage node contact.

8. The semiconductor device as claimed in claim 1, further comprising a lower spacer structure surrounding an outer surface of the contact barrier layer, the lower spacer structure including a portion extending from a side surface of the contact barrier layer along a side surface of the upper portion of the bit line contact.

9. The semiconductor device as claimed in claim 8, wherein the lower spacer structure includes:
a first upper surface coplanar with an upper surface of the contact barrier layer; and
a second upper surface at a level higher than a level of the first upper surface.

10. The semiconductor device as claimed in claim 1, further comprising:
conductive pads on the substrate;
an insulating pattern separating the conductive pads from each other; and
a buffer layer on the conductive pads and the insulating pattern, the storage node contact being in contact with the conductive pads through the buffer layer.

11. The semiconductor device as claimed in claim 10, wherein:
an upper end of the contact barrier layer is at a level lower than a level of upper surfaces of the conductive pads, and
the contact barrier layer is spaced apart from the conductive pads.

12. The semiconductor device as claimed in claim 1, further comprising a metal-semiconductor compound pattern on the active region, the bit line contact being spaced apart from the metal-semiconductor compound pattern by the contact barrier layer.

13. The semiconductor device as claimed in claim 1, wherein the lower portion of the bit line contact includes a metal material.

14. A semiconductor device, comprising:
a substrate including an active region, the active region having a first impurity region and a second impurity region;
a word line structure crossing the active region and extending in a first horizontal direction in the substrate;
a metal-semiconductor compound pattern on the first impurity region;
a conductive pad electrically connected to the second impurity region on the substrate;
an insulating pattern defining the conductive pad;
a buffer layer on the conductive pad and the insulating pattern;
a bit line structure extending in a second horizontal direction on the buffer layer, the bit line structure intersecting the first horizontal direction;

a bit line contact between the metal-semiconductor compound pattern and the bit line structure;

a contact barrier layer between the metal-semiconductor compound pattern and the bit line contact;

a storage node contact on the conductive pad; and an information storage structure electrically connected to the storage node contact, wherein:

the bit line contact includes a lower portion having a first width in the first horizontal direction and an upper portion on the lower portion and having a second width in the first horizontal direction, the first width is greater than the second width, and the contact barrier layer extends from a bottom surface of the lower portion to cover at least a portion of an outer surface of the lower portion.

15. The semiconductor device as claimed in claim 14, further comprising a spacer structure separating the bit line contact, the conductive pad, and the storage node contact from each other, the outer surface of the lower portion of the bit line contact being surrounded by the contact barrier layer, and an outer surface of the upper portion of the bit line contact being surrounded by the spacer structure.

16. The semiconductor device as claimed in claim 15, wherein the spacer structure covers at least a portion of an upper surface of the contact barrier layer.

17. The semiconductor device as claimed in claim 14, wherein:

the bit line contact includes at least one of tungsten (W), ruthenium (Ru), copper (Cu), and molybdenum (Mo), and the contact barrier layer separates the bit line contact from the metal-semiconductor compound pattern.

18. A semiconductor device, comprising:

a substrate including an active region;

a word line structure extending in a first horizontal direction parallel to a top surface of the substrate;

a bit line structure extending in a second horizontal direction on the substrate, the second horizontal direction being parallel to the top surface of the substrate and intersecting the first horizontal direction;

a bit line contact electrically connecting a first impurity region of the active region to the bit line structure, the bit line contact having a lower portion and an upper portion on the lower portion;

a storage node contact on a sidewall of the bit line structure and electrically connected to a second impurity region of the active region; and a contact barrier layer covering at least a portion of a side surface and a bottom surface of the lower portion of the bit line contact below the bit line structure, two first upper ends of the contact barrier layer being at a level lower than a level of the bit line structure and being covered by an upper spacer structure, the two first upper ends disposed on opposing first sides of the lower portion of the bit line contact in the first horizontal direction, the bit line contact covering two second upper ends of the contact barrier layer, and the two second upper ends disposed on opposing second sides of the lower portion of the bit line contact in the second horizontal direction.

19. The semiconductor device as claimed in claim 18, wherein the two second upper ends of the contact barrier layer are covered by the upper portion of the bit line contact.

20. The semiconductor device as claimed in claim 18, wherein the upper portion and the lower portion are integrally connected to each other.

* * * * *